US011678444B2

(12) United States Patent
Elenitoba-Johnson et al.

(10) Patent No.: US 11,678,444 B2
(45) Date of Patent: Jun. 13, 2023

(54) LOADING MECHANISM WITH INTEGRATED HEATSINK

(71) Applicant: Intel Corporation, Santa Clara, CA (US)

(72) Inventors: Olaotan Elenitoba-Johnson, Tigard, OR (US); Mark Hemmeyer, Hillsboro, OR (US); Mengqi Liu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 351 days.

(21) Appl. No.: 16/726,681

(22) Filed: Dec. 24, 2019

(65) Prior Publication Data

US 2020/0137896 A1 Apr. 30, 2020

Related U.S. Application Data

(60) Provisional application No. 62/848,247, filed on May 15, 2019.

(51) Int. Cl.
*H05K 5/00* (2006.01)
*H05K 7/20* (2006.01)
*H05K 1/02* (2006.01)

(52) U.S. Cl.
CPC ........... *H05K 5/006* (2013.01); *H05K 1/0209* (2013.01); *H05K 7/20154* (2013.01)

(58) Field of Classification Search
CPC .. H05K 5/006; H05K 1/0209; H05K 7/20154; G06F 1/20; G06F 13/4221; G06F 13/409
See application file for complete search history.

(56) References Cited

U.S. PATENT DOCUMENTS 4,780,570 A * 10/1988 Chuck .................. H05K 9/0016
361/818
5,467,254 A * 11/1995 Brusati ................ H05K 9/0039
174/355

(Continued)

FOREIGN PATENT DOCUMENTS

EP          1422982 A2      5/2004
EP          2202790 A2      6/2010

(Continued)

OTHER PUBLICATIONS

Extended European Search Report for Patent Application No. 20164271.7, dated Sep. 3, 2020, 8 pages.

(Continued)

*Primary Examiner* — Abhishek M Rathod
(74) *Attorney, Agent, or Firm* — Hanley, Flight & Zimmerman, LLC

(57) ABSTRACT

Examples described herein relate to a tool-less manner of forming an assembly with a circuit board carrier enclosure that provide leaf springs that provide a force against a circuit board to maintain a level surface of the circuit board. Multiple leaf springs can be used to apply a desired force to the circuit board. A heat sink can be mounted in the enclosure at a distance from the circuit board. The circuit board with carrier can be inserted without tools into an electrical connection for communications with other devices.

13 Claims, 22 Drawing Sheets

(56) References Cited

U.S. PATENT DOCUMENTS

| | | | | |
|---|---|---|---|---|
| 5,847,928 | A * | 12/1998 | Hinshaw | H01L 23/4093 24/457 |
| 6,606,246 | B2 * | 8/2003 | Wells | H01L 23/467 257/722 |
| 7,364,063 | B2 * | 4/2008 | Schaenzer | B23K 35/02 228/234.1 |
| 8,905,794 | B2 * | 12/2014 | Chawla | H01R 12/724 439/682 |
| 10,674,621 | B1 * | 6/2020 | Tsorng | H05K 5/0291 |
| 10,955,881 | B2 | 3/2021 | Gopalakrishna et al. | |
| 2005/0068740 | A1 * | 3/2005 | Ulen | H01L 23/4006 257/E23.087 |
| 2006/0002089 | A1 * | 1/2006 | Tran | H01L 23/4006 257/E23.09 |
| 2009/0190304 | A1 * | 7/2009 | Meyer, IV | G06F 1/20 361/679.47 |
| 2010/0157539 | A1 * | 6/2010 | Wang | H01L 23/4093 361/709 |
| 2013/0003292 | A1 | 1/2013 | Degner et al. | |
| 2013/0077254 | A1 * | 3/2013 | Nguyen | G02B 6/4246 29/428 |
| 2016/0374222 | A1 * | 12/2016 | Trout | H05K 7/1418 |
| 2018/0321715 | A1 * | 11/2018 | Gopalakrishna | G06F 1/20 |
| 2021/0320050 | A1 | 10/2021 | Robinson et al. | |

FOREIGN PATENT DOCUMENTS

| | | |
|---|---|---|
| GB | 2576032 | 4/2021 |
| GB | 2576030 | 12/2021 |
| GB | 2597525 | 2/2022 |
| GB | 2601357 | 6/2022 |

OTHER PUBLICATIONS

European First Office Action, (EP Exam Report Article 94(3) EPC), for Patent Application No. 20164271.7, dated Aug. 24, 2022, 7 pages.

Crider, Michael, "What Is the M.2 Expansion Slot, and How Can I Use It?", How-To-Geek, downloaded from https://www.howtogeek.com/320421/what-is-the-m.2-expansion-slot/, Aug. 7, 2017, 7 pages.

Fivetech, "Fivetech new addition product—SSD M.2 Card Clipper modernizes SSD harddisk assembly", Fivetk Blog—Comment, downloaded from http:// Fivetech new addition product- SSD M.2 Card Clipper modernizes SSD harddisk assembly,Jul. 18, 2016, 3 pages.

* cited by examiner

⑤ Position the heatsink over the heatsink snaps as shown. Depress the heatsink at the center until the heatsink base engages with the snap features as shown. Inspect all four snaps to verify engagement.

LOADING MECHANISM WITH INTEGRATED HEATSINK

RELATED APPLICATION

The present application claims the benefit of priority date of U.S. provisional patent application Ser. No. 62/848,247, filed May 15, 2019, the entire disclosure of which is incorporated herein by reference.

DESCRIPTION

M.2, formerly known as the Next Generation Form Factor (NGFF), is a specification for internally mounted computer expansion cards and associated connectors for coupling to other devices in a server, rack, or blade architecture. M.2 replaces the mSATA standard, which uses the PCI Express Mini Card physical card layout and connectors. M.2 provides a flexible physical specification that allows different module widths and lengths. With the availability of more advanced interfacing features, M.2 is capable of use for solid-state storage applications. An M.2 assembly can provide an assembly for a circuit board with heat generating processor or storage devices as a well as a heat sink. M.2 boards can be used to mount solid state storage, persistent memory (e.g., Intel® Optane™ or Samsung Z-NAND), volatile memory, central processing unit, graphics processing unit, any accelerator device.

BRIEF DESCRIPTION OF THE DRAWINGS

FIGS. 3A-1 and 3A-2 depict perspectives of example embodiments of a retention carrier.

DETAILED DESCRIPTION

Figure 1A:
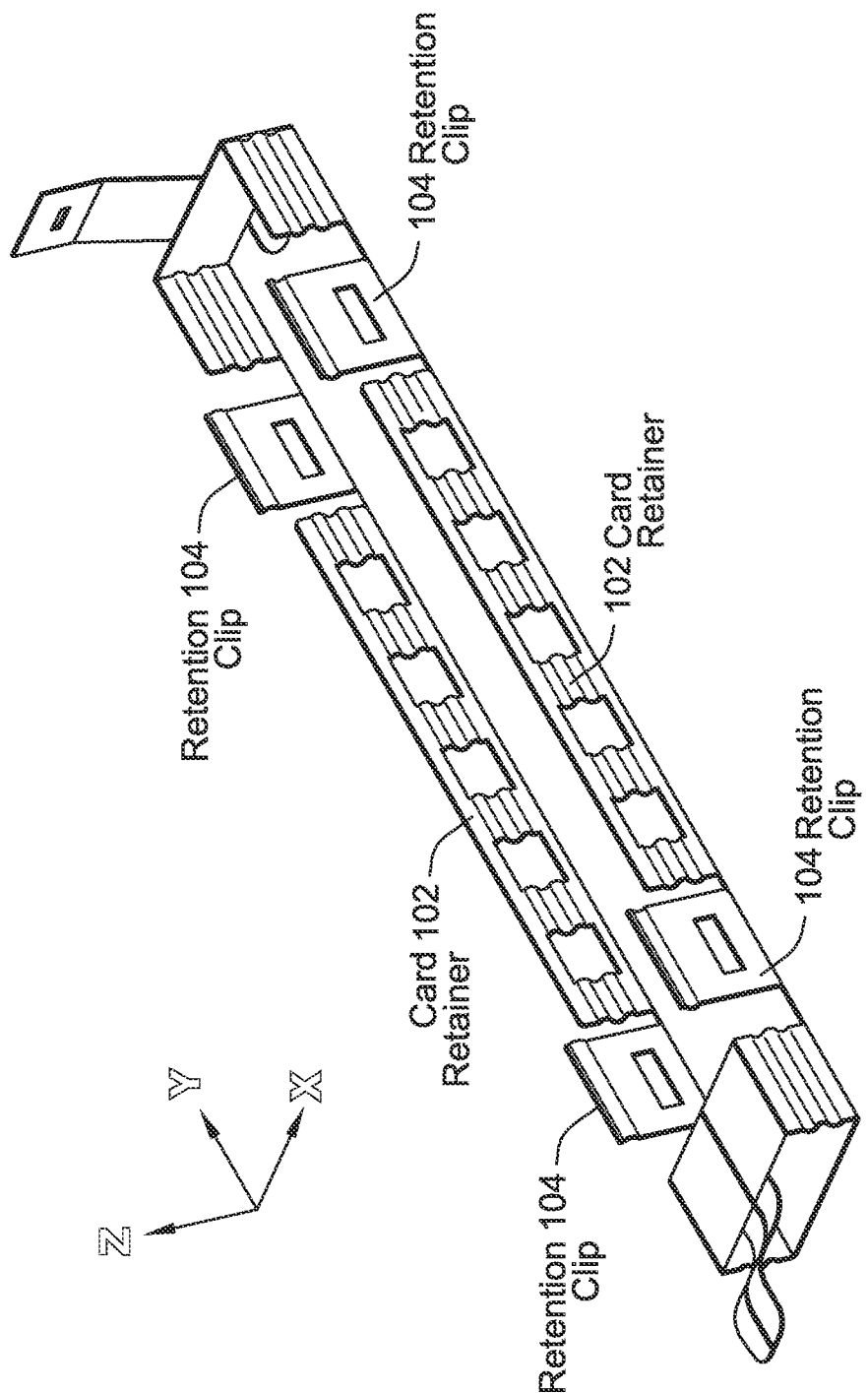
FIG. 1A depicts a view of an example retention carrier.

To control a position of an M.2 card within a heatsink assembly, some solutions control the position using thermal gap pads. Gap pads are a chewing gum-like material that is flexible, viscous and deforms. Example gap pads are available from various sources. For example, Taica Corporation's thermally conductive gap filler is product 30230-366069. Another example used to control a position of an M.2 card within a heatsink assembly is Fujipoly's SARCON Thermal Gap Filler product.

A potential problem with use of gap pads to control a position of a circuit board card is a high thermal resistance. High thermal resistance can lead to too much heat retention and a poor conduction through the pad. In addition, a gap pad may not provide as close or intimate a contact as desired with the card which can lead to heat not being pulled from or directed away from a heat emitting device (e.g., processor or storage device) as needed to cool the device. Moreover, the use of gap pads can limit the power density of the processor or device.

Some solutions for controlling a position of a card in a heatsink assembly (e.g., EKWB EK-M.2 NVMe Heatsink) have used individual clips as opposed to an integrated loading mechanism. The use of individual clips in retaining the board and heatsink often fails during basic use and handling because the individual clips are combined with thermal gap pads. The shape of the pads change with time, and do not account for loosening of the gap tolerance.

Various embodiments provide a tool-free retention mechanism that robustly constrains M.2x boards, where x is an integer (and other sized circuit boards) and enables the use of a high-performance thermal interface material to the heatsink. For example, retention mechanisms can be used for M.4 or other small printed circuit assemblies approximately less than 70 mm×125 mm sized circuit boards. However, embodiments can be used for any sized circuit board. A tool-free thermal enclosure and assembly for an M.2x card can house one or more high-powered processors. Tool-less assembly reduces final product cost by speeding-up high volume assembly. Tool-free and tool-less can refer to assembly and disassembly being performed by hand and not needing tools such as drivers and wrenches for assembly or disassembly. According to various embodiments, loading springs can maintain contact force to a board or card throughout the life of the assembly.

Various embodiments provide for integration into a Peripheral Component Interconnect express (PCIe) compatible M.2 carrier card and constraining the M.2 card using a retention mechanism. For example, various specifications for M.2 include PCI Express M.2 Specification Revision 3.0, Version 1.2 (2013) and Serial ATA International Organization (SATA-IO) revision 3.2 specification, both of which are incorporated by reference in their entirety. A retention mechanism allows controlling X-axial, Y-axial, and Z-height direction variation of the circuit board toward or away from a base of the retention mechanism device. Various embodiments control the vertical position (Z-height) of the circuit board or card by use of leaf springs and provides a modulated stabilizing force over the circuit board or card profile. Variation in vertical distance (Z-height direction) can impact electrical connections made by the retained circuit board. If the retained circuit board is slanted up or down, insufficient contact with external contacts may result. Accordingly, a plane of a circuit board can be controlled by use of leaf springs and a bridge lance above and over the circuit board. By contrast, if gap pads are used, when gap pads heat up, gap pads can deform and the plane of the circuit board can change. Control of deformation of the board within the retention mechanism can positively affect and enhance end of life reliability of the M.2 card or other card.

Various embodiments provide a retention mechanism that allows for the use of Thermal Interface Material (TIM), which can be a superior thermal solution than gap pads. Various embodiments provide a retaining channel that strengthens and stiffens the printed circuit board (PCB) assembly and can reduce overall vibration and improve reliability. Various embodiments enable higher performance through increased power density capabilities of devices.

Note that any example provided herein can be combined with any other example, even if described with respect to different figure numbers.

FIG. 1A depicts a view of an example retention carrier. The retention carrier can be used to carry a printed circuit board (not depicted) with one or more circuits attached to the circuit board and also affix a heat sink. The printed circuit board can slide into a recessed C shaped slot of card retainer 102. In some embodiments, retention clip 104 is physically separate from card retainer 102 and can be longer in the Z direction than the card retainer 102 away from the base. Retainer clip 104 provides a top hug operation that presses a heat sink down towards a base of the retention carrier or otherwise maintains a distance of circuit board from a base of the card retainer.

Figure 1B:
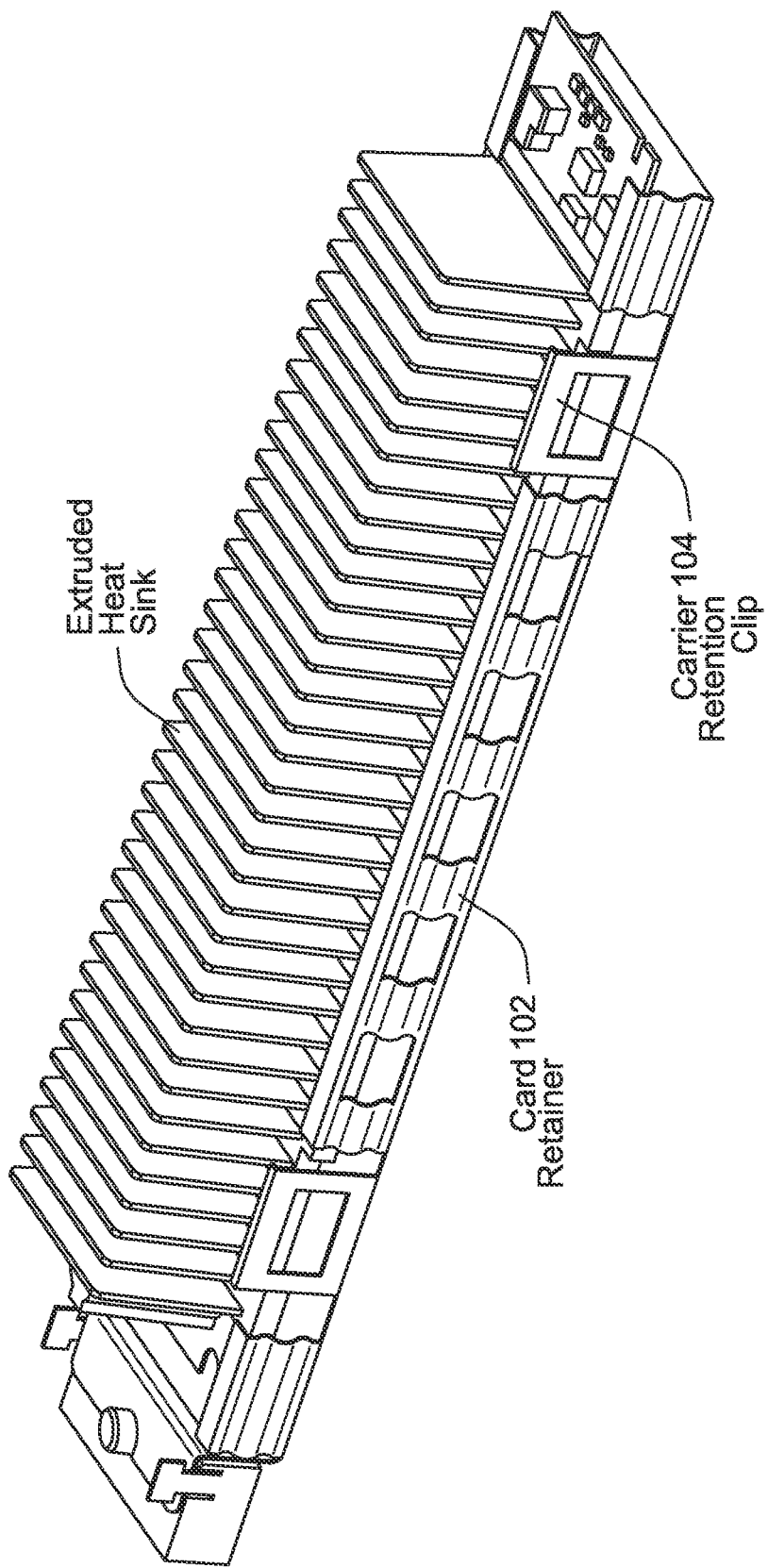
FIG. 1B depicts a view of a retention carrier, circuit board, and heatsink assembly.

FIG. 1B depicts a view of a retention carrier, circuit board, and heatsink assembly. In this example, an extruded heat sink is mounted to the retention carrier. In some embodiments, card retainer 102 is physically separate from retention clip 104. A recessed C-shaped slot of card retainer 102 holds a circuit board. Card retainer 102 and retention clip 104 provide related functions of retaining the heat sink but card retainer 102 retains a card or board independent from use of retention clip 104. Card retainer 102 includes a shelf that stabilizes a bottom of the heat sink away from a circuit board mounted in card retainer 102 and retention clip 104 includes a protruding lip that prevents the heat sink from moving up and away from a base of the retention carrier. Together, card retainer 102 and retention clip 104 attempt to maintain a position of a base of the heat sink at a distance and parallel relative to a base of retention carrier. Retention clip 104 includes a physically separate tab that has a protruding portion at a distal end in the Z-direction away from a base of the retention carrier (shown in FIG. 1D) to abut a top surface of the heat sink (shown) and provide downward pressure to at least edges that extend away from the heat sink vanes causing the heat sink assembly to be pressed down or toward the circuit board.

Figure 1C:
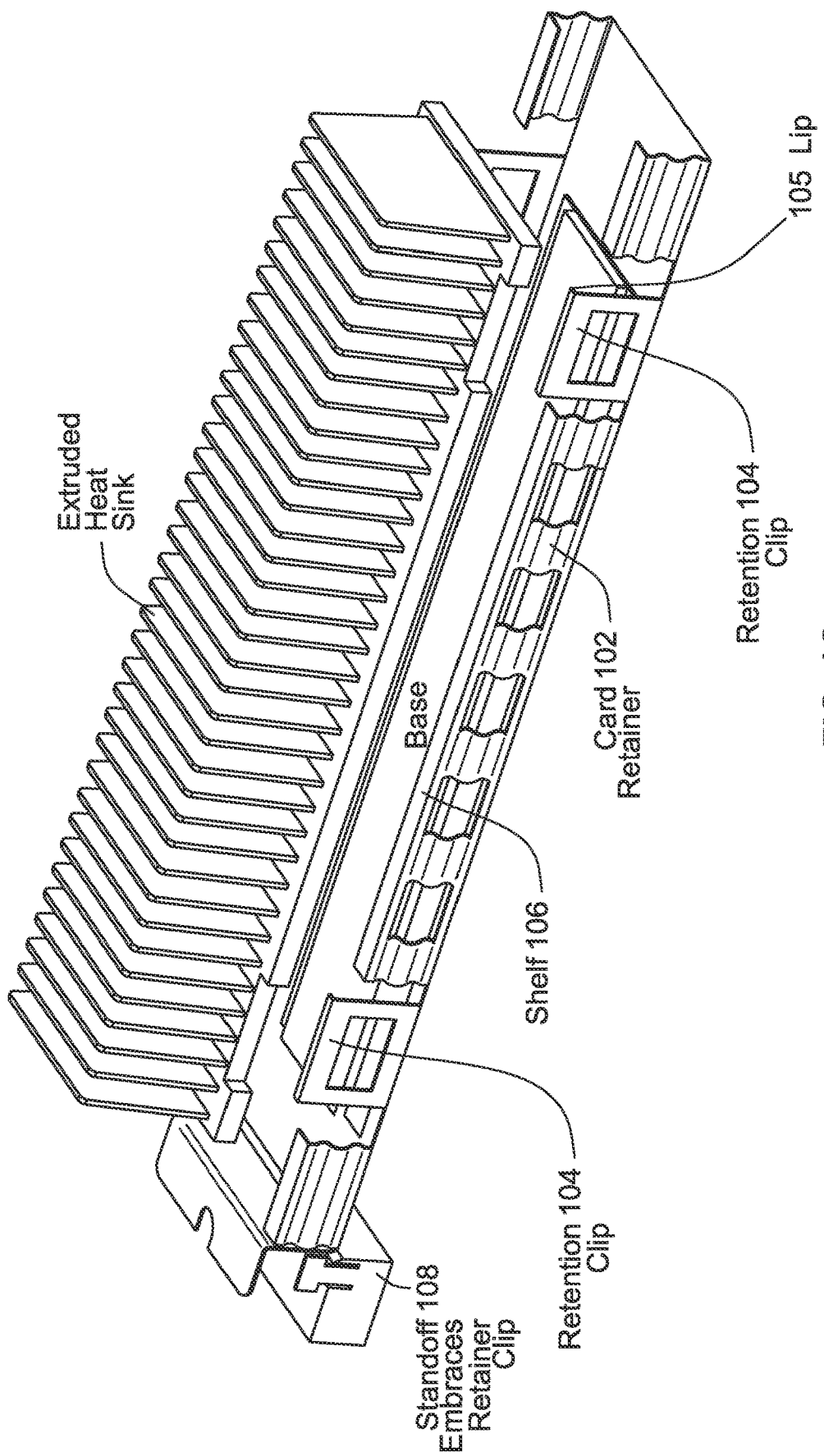
FIG. 1C depicts an exploded view of a retention carrier and heatsink.

FIG. 1C depicts an exploded view of a retention carrier and heatsink. FIG. 1C shows a perspective of carrier retention clip 104 with lip 105 which clasps the heatsink. In this example, four retention clips 104 are used and each retention clip includes a lip 105 or half circle-shaped, moon-shaped protrusion that, when the heatsink is inserted under lip 105, covers an edge of the heatsink and prevents the heatsink from escaping up and away from a base of the retention carrier. Lip 105 is placed at a height such that the heatsink is positioned over the circuit board and the circuit board is located between the base and the heat sink. A shelf 106 (e.g., ledge) on card retainer 102 can oppose lip 105 so that when a heat sink is placed between lip 105 and shelf 106, the heat sink is maintained in a plane above the base of the carrier. All of four retention clips 104 can have the same thickness and height. Other number of retention clips 104 can be used such as 4, 6, or any multiple of 2. A standoff can embrace a retainer clip 108 such that retainer clip 108 is inserted into the standoff.

Figure 1D:
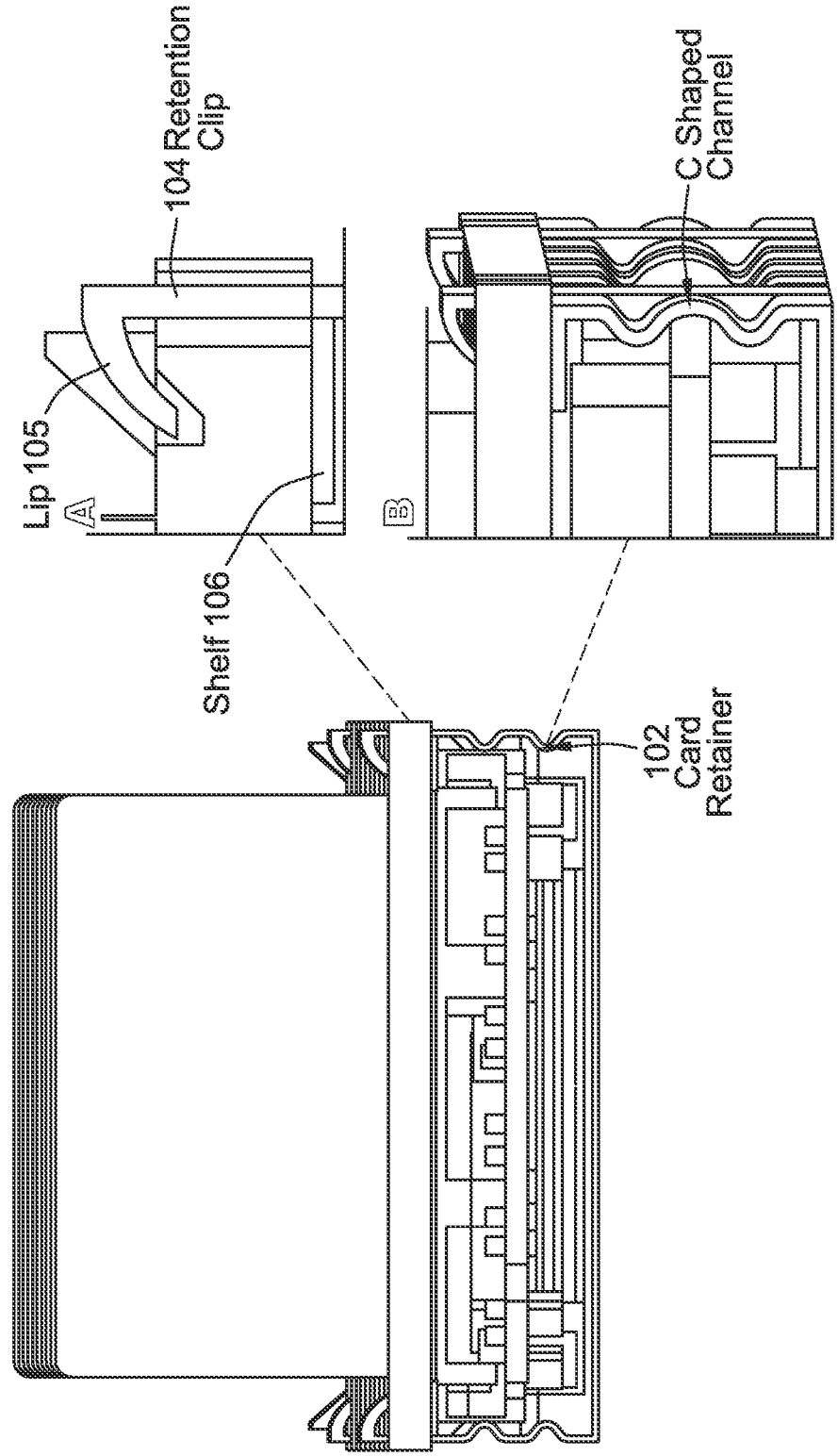
FIG. 1D depicts another view of a retention carrier and heatsink assembly.

FIG. 1D depicts another view of a retention carrier and heatsink assembly. Item A shows a cross section of a retention mechanism whereby carrier retention clip 104 clamps a heatsink and stabilizes the position of the heatsink so that the heatsink sits on shelf 106 of the card retainer 102. Lip 105 pushes down on the board and C-shaped curves of card retainer 102 support and push up toward the card or board. Lip 105 as shown may be comprised of a hook like element that arcs downward and in one embodiment may mate with a hole, slot or groove in the heat sink assembly as shown. Shelf 106 can be an L-shaped prong on top of card retainer 102 that opposes the lip 105 and can cause the heat sink to be offset from the circuit board.

Item B of FIG. 1D shows a bridge lance retainer showing an M.2 card in a middle channel (recessed C-shaped channel) within card retainer 102. Card retainer 102 can have joined C-shaped and opposing C-shaped curves (or S-shaped curves) that provide a tension that opposes lip 105 when lip 105 engages a top surface of board and opposes shelf 106. Retention clips 104 themselves are shown as one or a plurality of extended prongs with one or more C-shaped curves (or S-shaped curves) that provide tension and hold a card or board.

Figure 2:
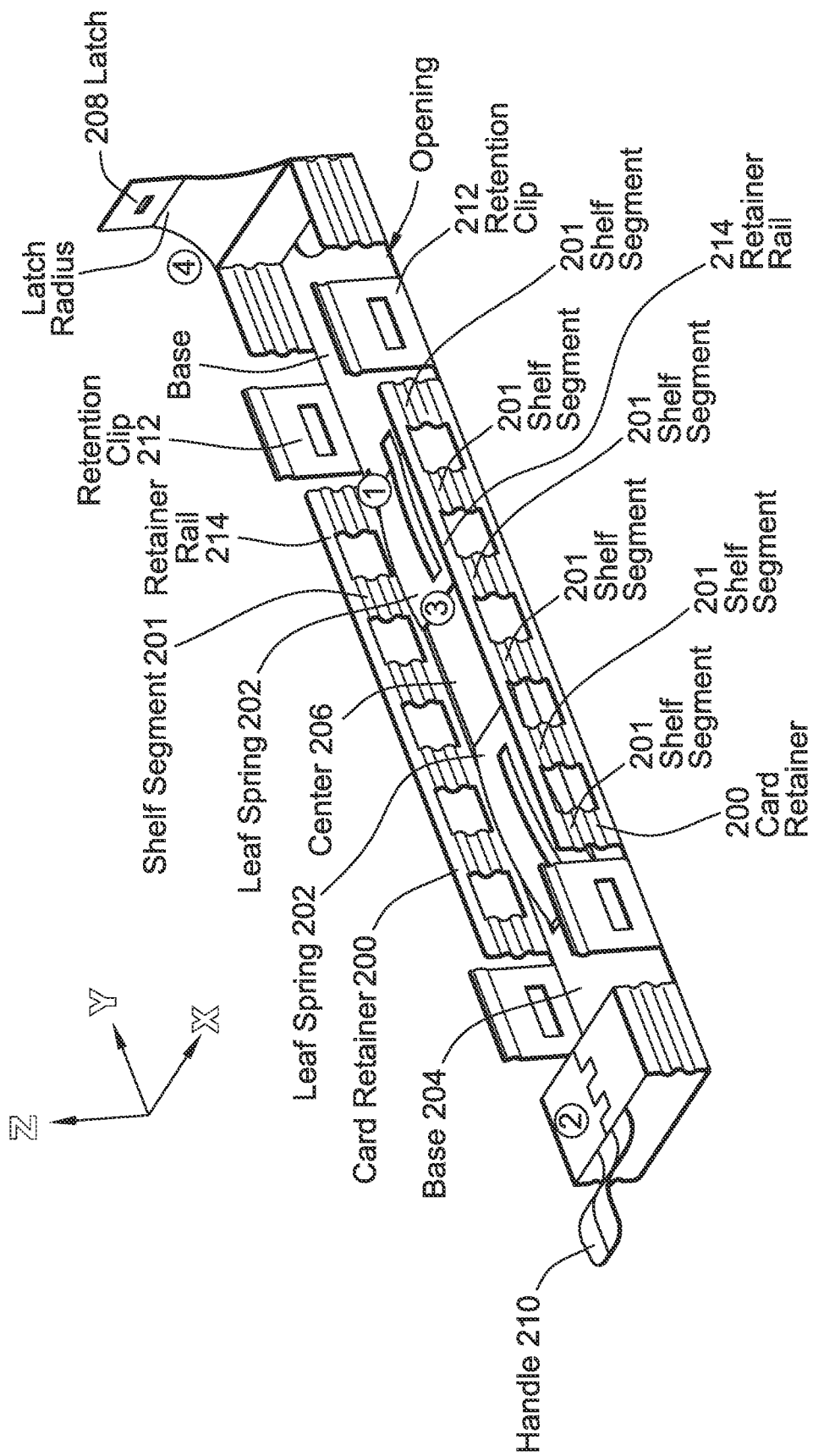
FIG. 2 depicts a perspective of an example retention carrier.

FIG. 2 depicts a perspective of an example retention carrier. In this example, a C shaped slot within a card retainer is not used to hug a top and bottom of an edge of a card, however, it can be used in any embodiments. Card retainer 200 includes one or more top limiter shelf segments 201 (item (1)) whose bottom surface touches a top edge of an inserted card (not shown) and opposes a force exerted against the card by tunable leaf springs 202. Shelf segment 201 can be a protruding C-shaped surface within card retainer 200 that extends towards the interior of retention carrier. In this example, six shelf segments 201 of card retainer 200 on each side of retention carrier are shown with openings between adjacent lip segments. However, any number of shelf segments 201 can be used. To avoid cluttering the FIG. 2, not all shelf segments 201 are labeled. A top surface of shelf segment 201 of card retainer 200 can be used to provide an upward force towards a bottom of a heat sink (not shown) and oppose a clamping by a lip of a retention clip 212. A retainer rail 214 can keep the heat sink from shifting in the positive or negative X directions.

Retention carrier includes tunable leaf springs 202 attached and part of base 204. In this example, two leaf springs 202 are used. A leaf spring 202 can be a U-shaped, C-shaped, or D-shaped (or other shape) with an opening or thinner material in its middle portion. Leaf springs 202 can be formed in base 204 along the Y axis in order that ends of the leaf springs 202 are raised out of the base and point towards each other at center 206. Leaf springs 202 can press a center of a board to maintain bond line thickness to achieve thermal efficiency performance and press center of board to not damage board and keep board flat. In some examples, any number of leaf springs 202 can be used. In some examples, a single leaf spring can be used. In some examples, a multiple of 2 number of leaf springs 202 can be used such as 4, 6, 8, and so forth. For example, leaf springs 202 can be oriented along the X axis and Y axis and point towards center 206. Leaf springs 202 can be rotated 90 degrees within the X-Y plane from that which is shown and attached to base 204. Leaf springs 202 need not be symmetrical or identical and can be different shapes.

Leaf spring 202 can have an arch or radial axis such that a curved portion of leaf spring 202 is an upward arced surface (with an apex in the Z direction away from base 204). However, leaf spring 202 be a flat surface with a landing that contacts a board. A surface of leaf spring 202 that presses a circuit board can be flat or an arch with an apex that presses against the circuit.

One or both leaf springs 202 can include an opening where the opening size is selected to set a force exerted by a leaf spring formed by a tongue affixed and proximate to base 204 of the carrier and having a distal end angled upwards away from base 204. In addition, a shape, length and thickness of leaf springs 202 can be set to provide a particular force upwards away from base 204 in the Z direction. An amount of force applied by leaf springs 202 can be tuned by adjusting its thickness or material of leaf spring 202 to increase or decrease strength uniformly or non-uniformly along leaf spring 202 to its attachment to the base. In some examples, leaf springs 202 exert a total of 10 pounds per square inch upwards away from base 204 in the positive Z direction. In some examples, a thickness range for a leaf spring 202 for supporting an M.2 board can be 0.3 to 0.5 mm+/−0.02 mm.

Latch 208 is curved according to a radius to stiffen the latch at (4). The stiffness of latch 208 can be adjusted by changing a radius or location of latch 208. However, latch 208 can be flat and not curved. Other shapes of latch 208 can be used such as S-shape or C-shape. Latch 208 can be used for mounting retention carrier into compute resource rack or sled.

At item (2), a dovetail joint is provided to handle 210.

In an embodiment, portions of the retention carrier can be constructed of 1085 spring steel with thickness range of 0.3 to 0.5 mm+/−0.02 mm. However, the thickness or width of one or both leaf springs 202 can be varied to adjust applied force by leaf spring 202 in the positive Z, positive X, and/or positive Y directions.

In FIG. 2, the arrow refers to an opening that could allow twisting of the base of retention carrier due to heat or weight loading.

Figures 1, 3A:
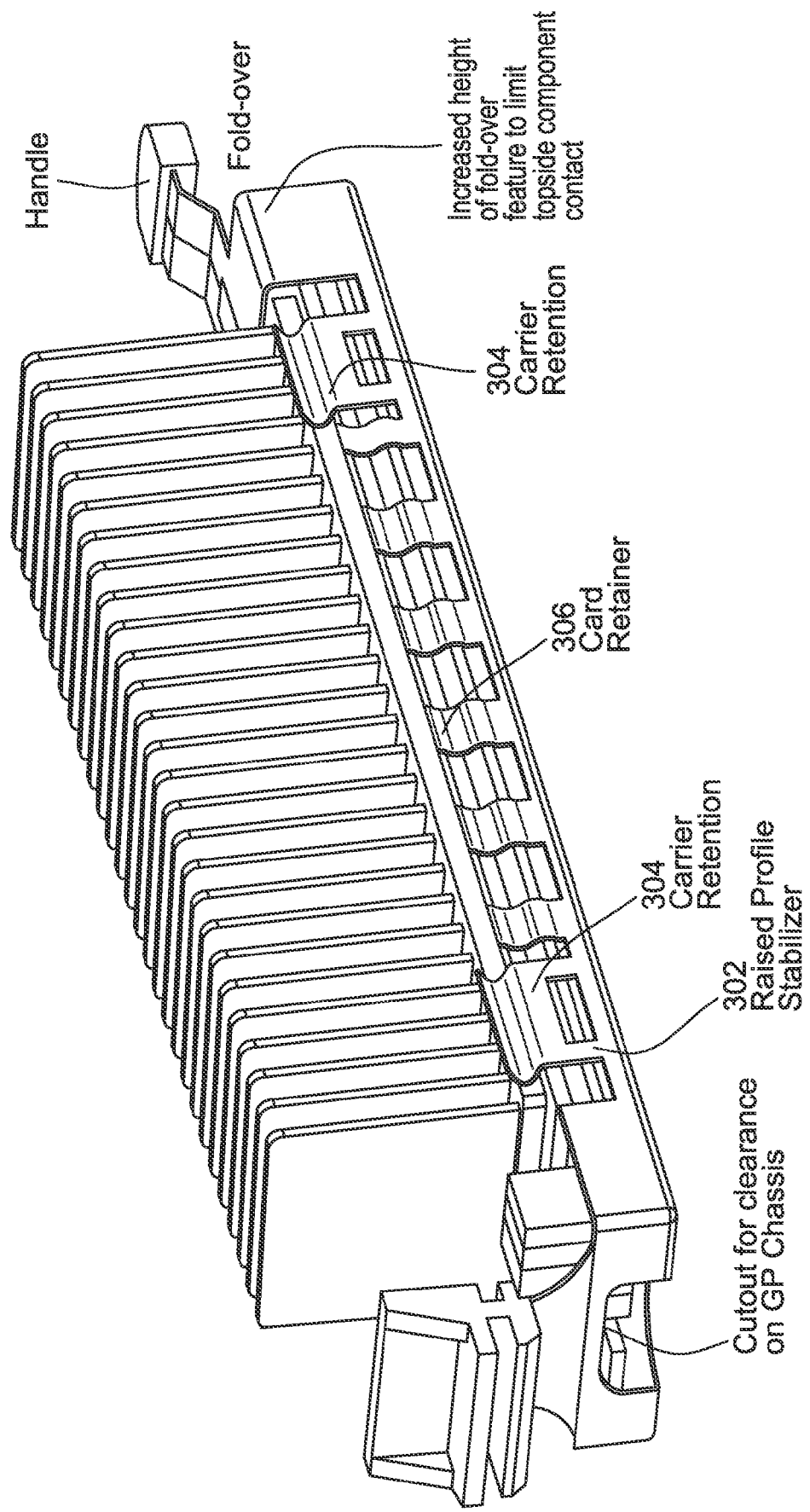
Figures 2, 3A:
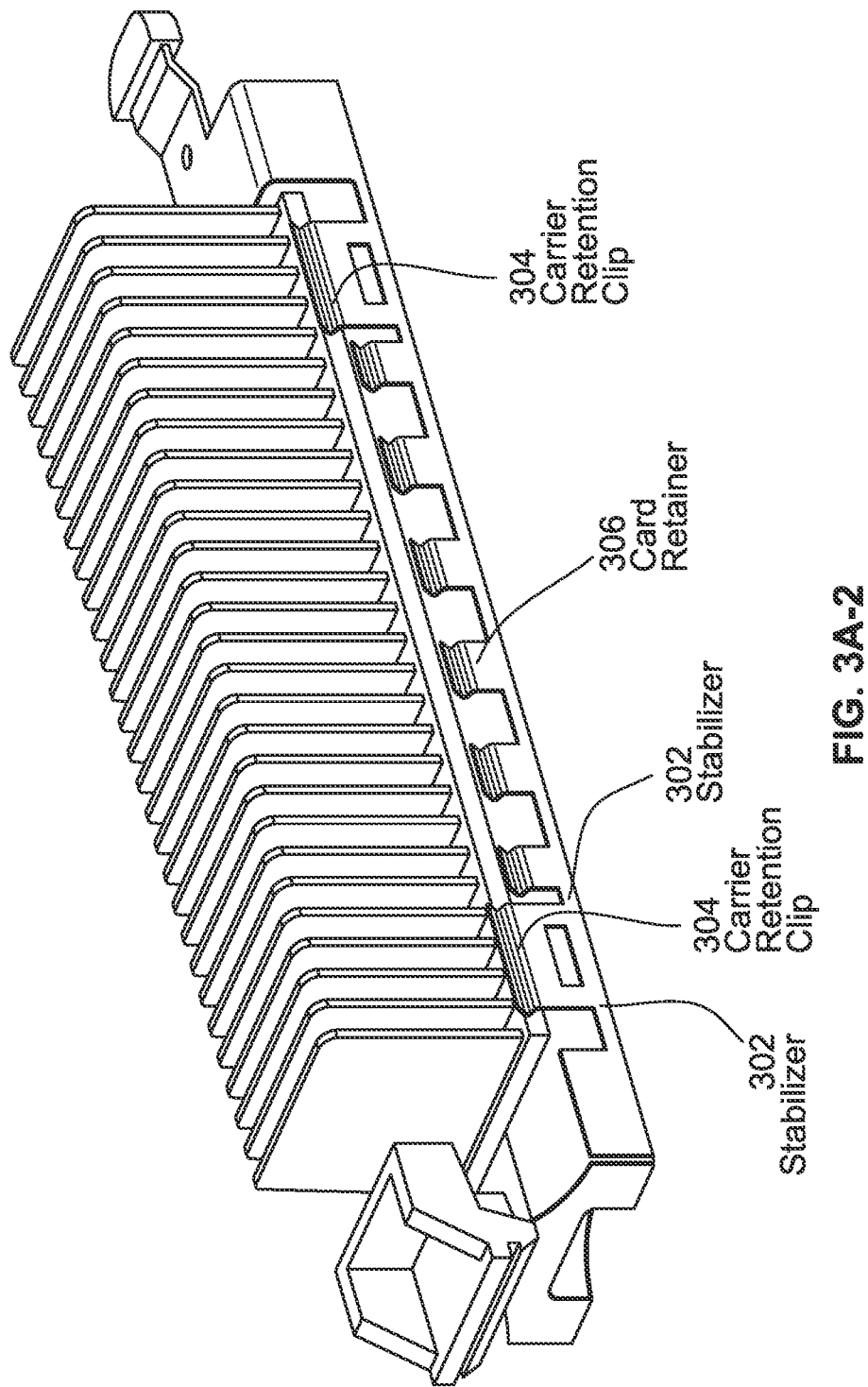

FIG. 3A-1 depicts a perspective of an example embodiment of a retention carrier assembly. FIG. 3A-2 depicts another perspective of an example embodiment of a retention carrier assembly. Various embodiments provide a supporting side wall and raised profile stabilizer 302 on both sides of the carrier retention clip 304 to the heat sink. Raised profile stabilizer 302 can be on one or both sides of the carrier retention clip 304 to the heat sink and affixed to its base. In this example, there are four carrier retention clips 304. In some examples, a material thickness for retention clips 304 could range from 0.2 mm to 0.5 mm. Raised profile stabilizer 302 helps stabilize a carrier retention clip 304, improves overall stiffness of the retention carrier, and can reduce twisting of the retention carrier referenced in FIG. 2. A height of raised profile stabilizer 302 can be at least 2 mm away from a base of retention carrier. In some examples, a range of height of raised profile stabilizer 302 can be 3.12 mm+/−0.1 mm. Stabilizer 302 can be the same thickness as carrier retention clip 304 or thicker or thinner. Stabilizer 302 can be attached between retention clip 304 and card retainer 306.

Retention carrier also provides a fold-over with increased distance from highest points of components on the circuit board to a bottom surface of the fold-over that faces a circuit board (e.g., M.2 board). The increased distance can help avoid short circuits by contact with circuits of the circuit board. The folder-over can have attached arms that attach to a handle.

In some embodiments, the retention carrier can be constructed of SK7 spring steel with 0.4 mm thickness, although any thickness range can be used. The thickness of one or both leaf springs (not visible from the perspective of FIGS. 3A-1 and 3A-2) can be varied to adjust applied force by the leaf spring. A material of leaf springs could be aluminum alloy and/or steel alloy. A surface of retention carrier can be polished. In some examples, a nickel plating can be applied to a surface of retention carrier.

Figure 3B:
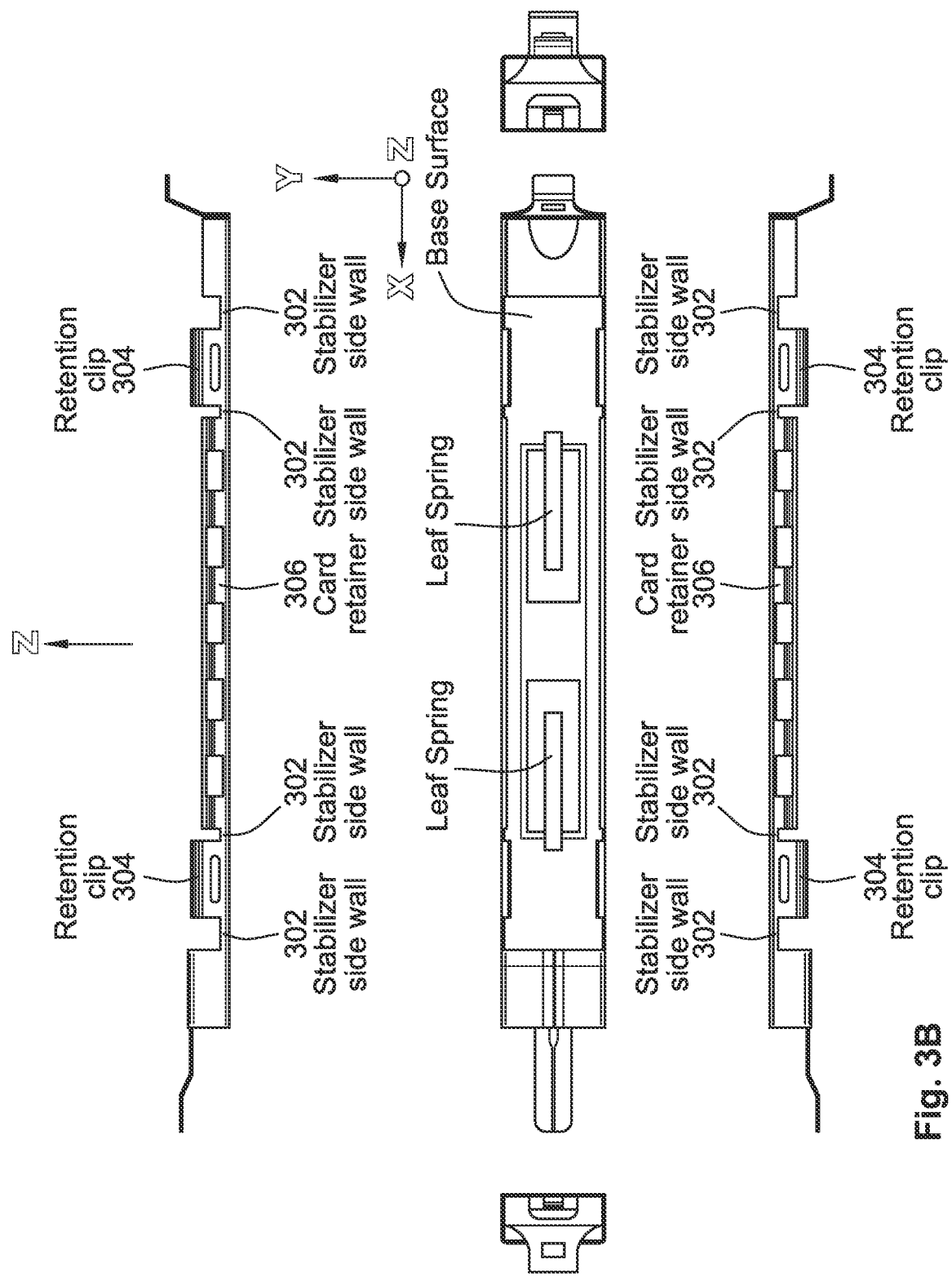
FIG. 3B depicts a schematic diagram showing perspectives of an embodiment of a retention carrier.

FIG. 3B depicts a schematic diagram showing perspectives of an embodiment of a retention carrier. A Z direction is perpendicular to a bottom surface (base surface) of the carrier. X and Y directions are in the plane of the base surface of the carrier. In particular top-down (−Z direction) and Y direction perspectives are shown to shown stabilizer side walls 302 in relation to retention clips and card retainer 306. Dimensions listed in FIG. 3B are in millimeters but are examples and other dimensions can be used. Tolerances can be in accordance with ASME Y14.5-2009.

Figure 3C:
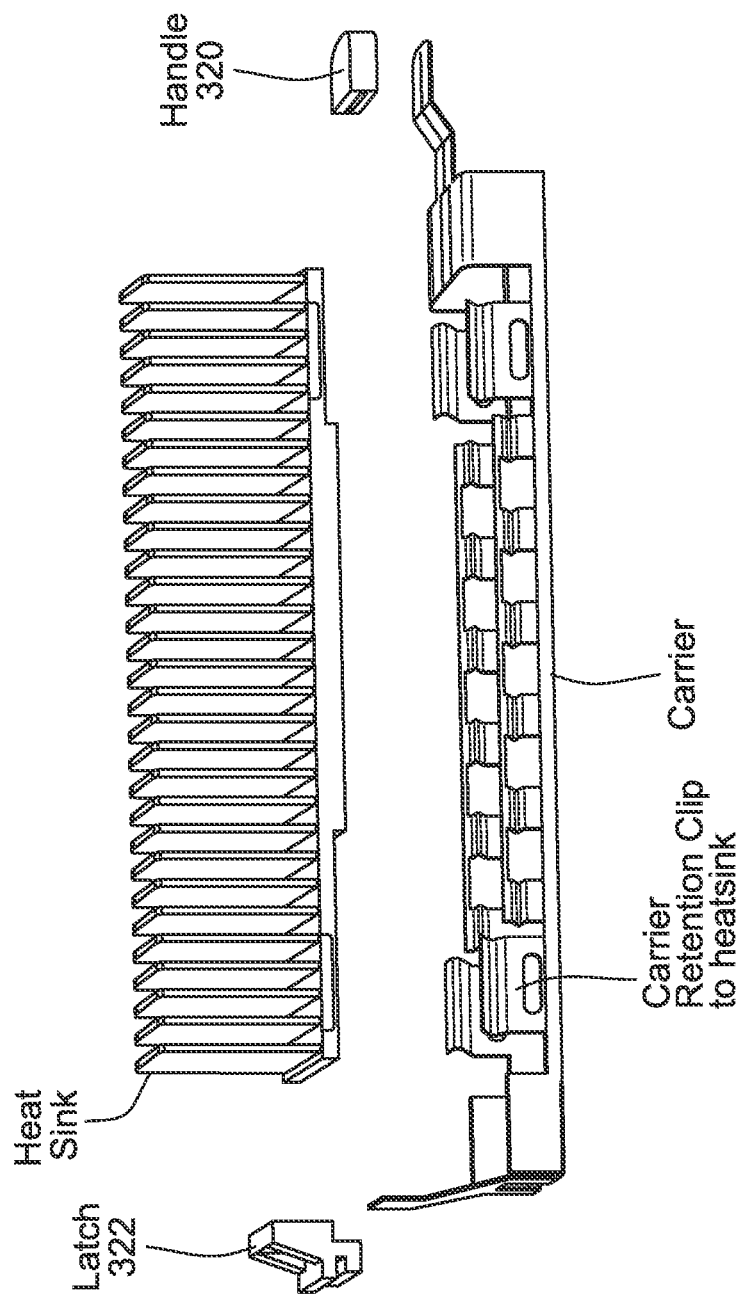
FIG. 3C depicts an example exploded view of a retention carrier and a heat sink.

FIG. 3C depicts an example exploded view of a retention carrier and a heat sink and a side perspective of a retention carrier and a heat sink. Latch 322 can be affixed or attached to a latch of the carrier. Handle 320 can be affixed or attached to a handle portion of the carrier. For example, a handle can be made of polycarbonate-ABS (PC-ABS), a thermo-plastic.

Figure 3D:
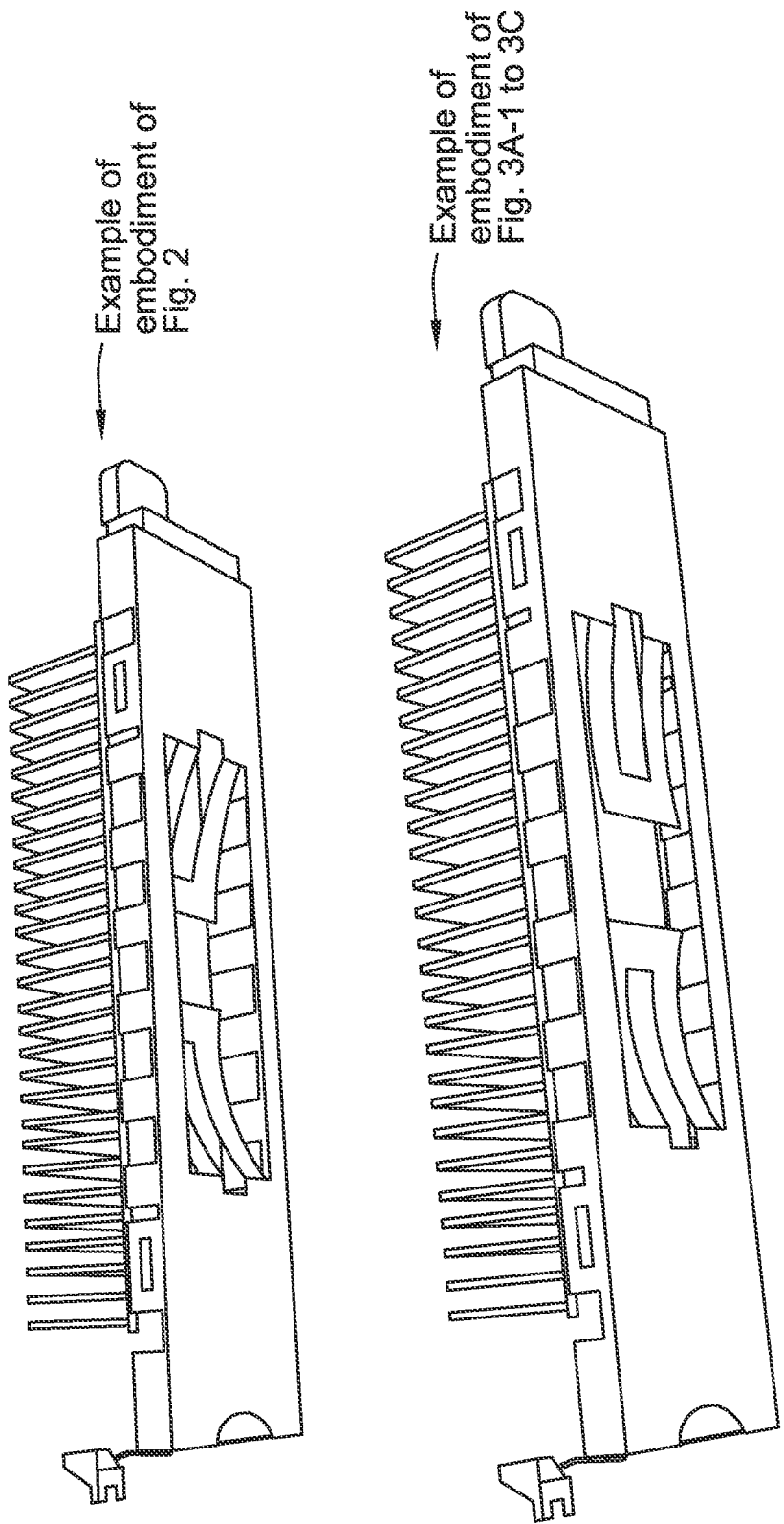
FIG. 3D depicts an example perspective of carrier retention devices with attached circuit boards and heat sinks.

FIG. 3D depicts an example perspective of carrier retention devices with attached circuit boards and heat sinks. For example, embodiments described with respect to FIG. 2 and FIGS. 3A-1 to 3C are shown.

Figure 3E:
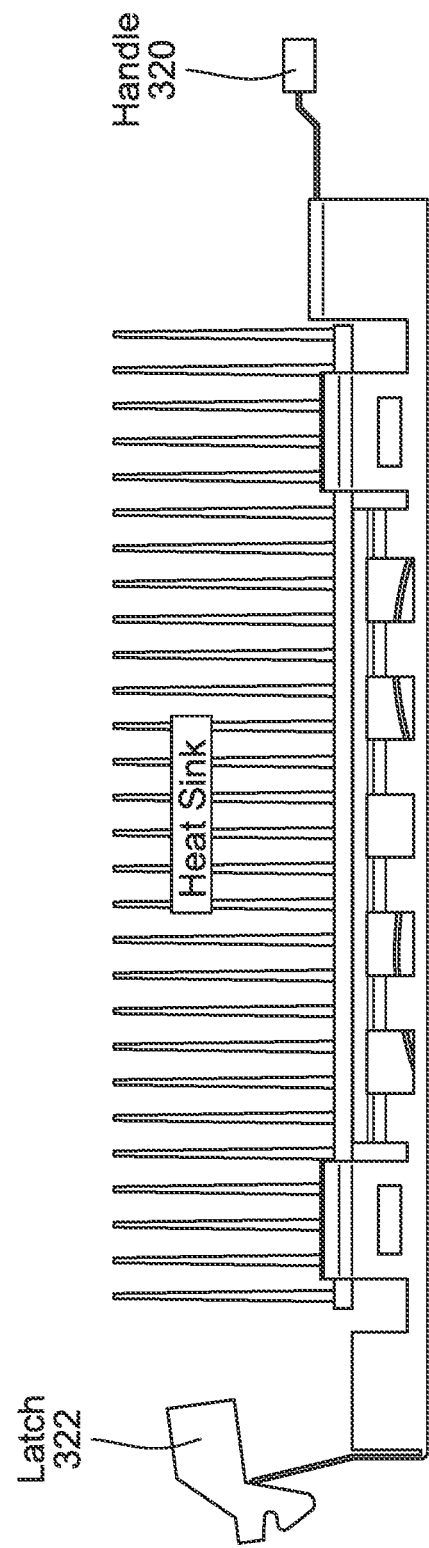
FIG. 3E depicts a view of a carrier assembly.

FIG. 3E depicts a side view of a carrier assembly with heat sink, latch, and handle.

Figure 3F:
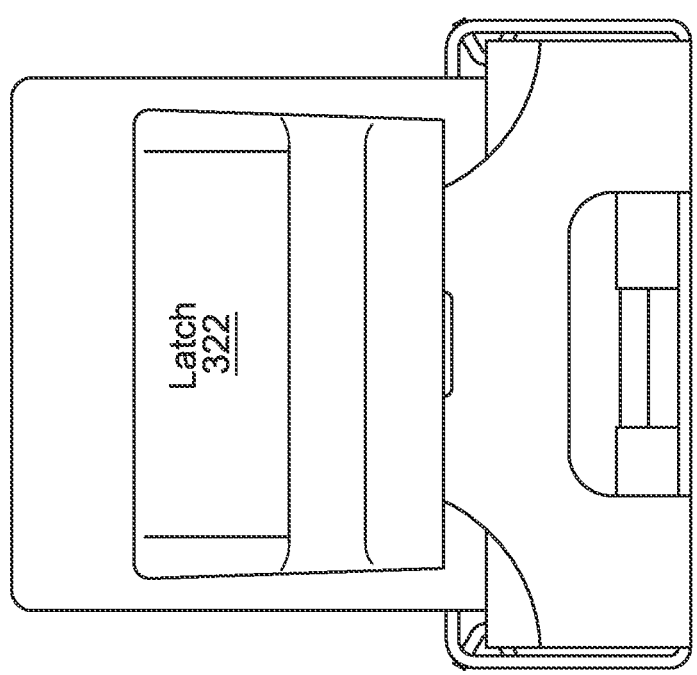
FIG. 3F depicts a side view perspective a carrier assembly.

FIG. 3F depicts a side view perspective a carrier assembly with heat sink from the side with the latch.

Figure 4A:
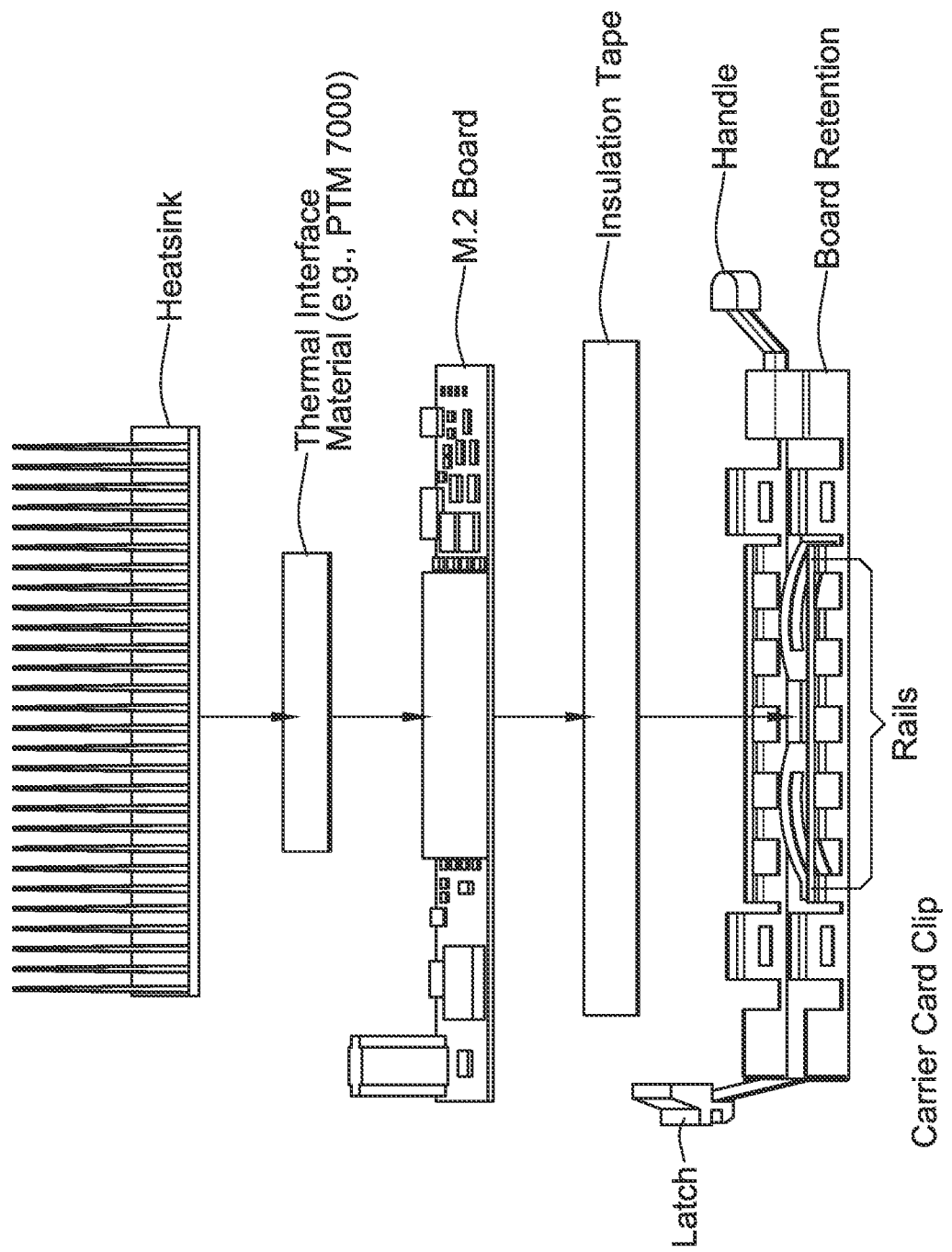
FIGS. 4A-4G depict an example of an assembly operation of a carrier retention device with a heat sink and circuit board.

FIGS. 4A-4G depict an example of a tool-free assembly operation of a carrier retention device with a heat sink and circuit board. Referring to FIG. 4A, an exploded view is shown of components of a system of a carrier retention device with heat sink, thermal interface material, M.2 board, insulation tape, and carrier.

Figure 4B:
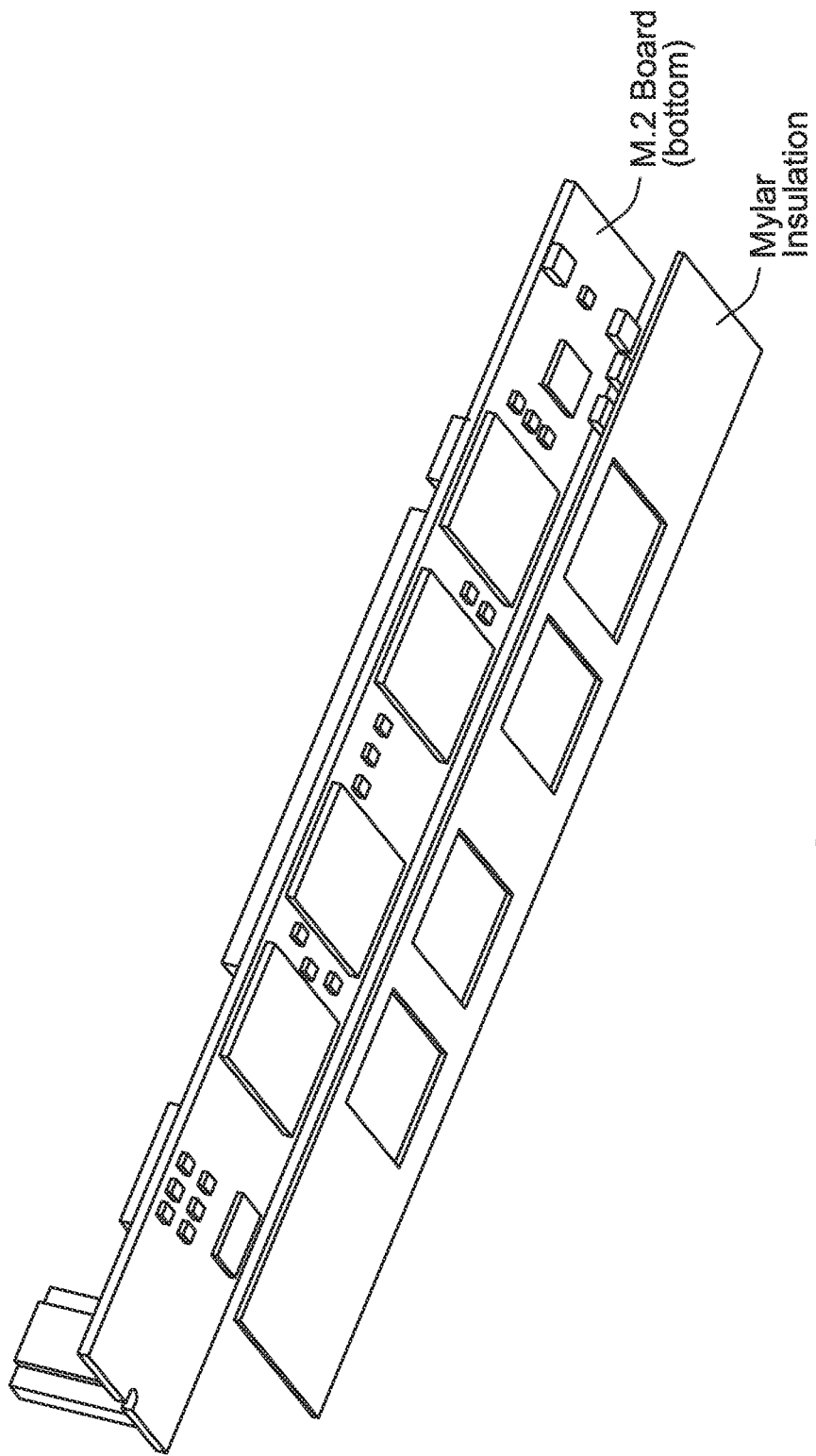

FIG. 4B shows a first step of providing insulation tape to a bottom surface of an M.2 board. Other types of circuit boards can be used. Other types of insulation tape can be used such as Mylar®, Kapton or other electrical or thermally insulating material.

Figure 4C:
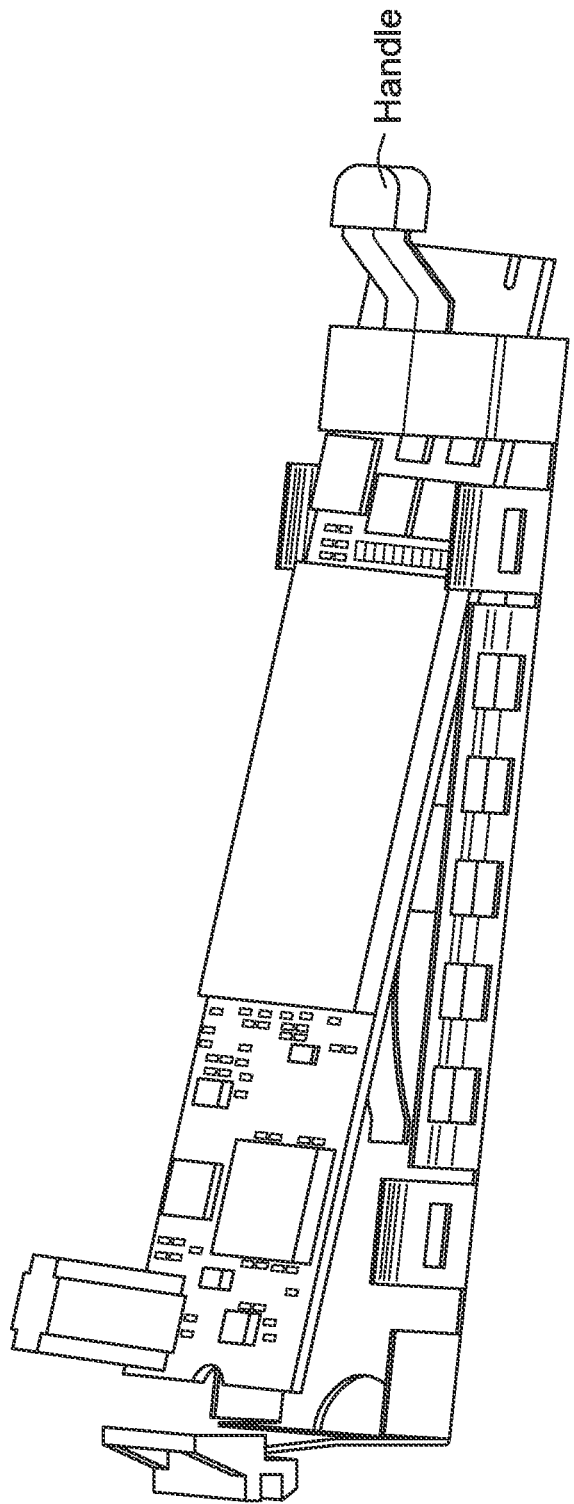

FIG. 4C shows a second step of sliding an M.2 board through the retention assembly with the gold contact connectors oriented towards the handle and against the leaf springs. Care should be taken to avoid scraping the top side and bottom side components on the retention assembly and that Mylar® tape (or other insulating tape) is installed on the bottom of the M.2 board, preventing contact of the board or components on the board with the leaf springs or surface of the retention assembly.

Figure 4D:
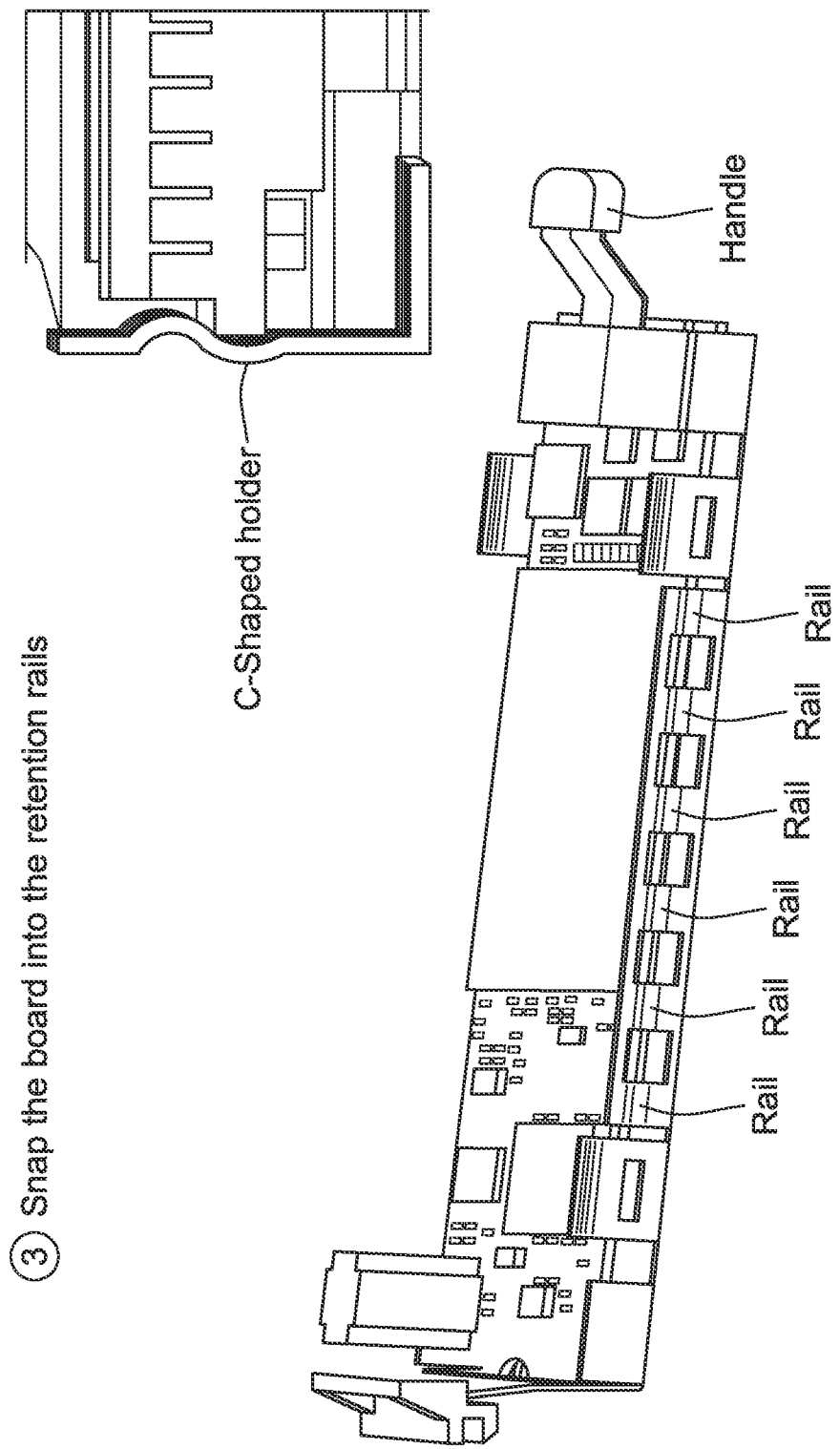

FIG. 4D shows a third step of affixing the board into C-shaped holders or underneath rails of the card retainer rails by pressing the board towards leaf springs on the bottom surface of the retention carrier. Assembly should be performed in an electrostatic discharge (ESD) free environment. Care should be taken to avoid touching uninsulated components as much as possible and avoid pressing down on the die (e.g., processors or other components).

Figure 4E:
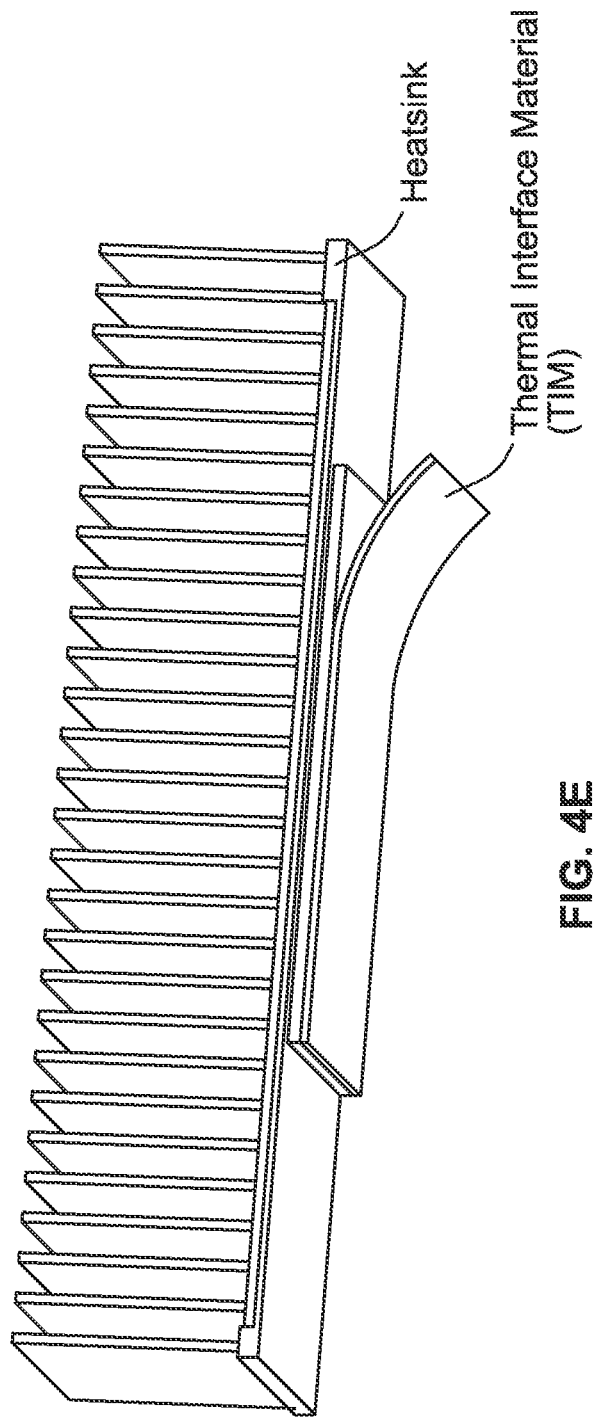

FIG. 4E shows a fourth step of preparing a heatsink for installation. Installation of a thermal interface material on the underside of the heatsink can be performed. Assembly should be performed in an ESD free environment. Prior to proceeding to a next step, care should be taken to ensure that the thermal insulation material (TIM) is installed on the bottom, flat side of the heat sink and flat.

Figure 4F:
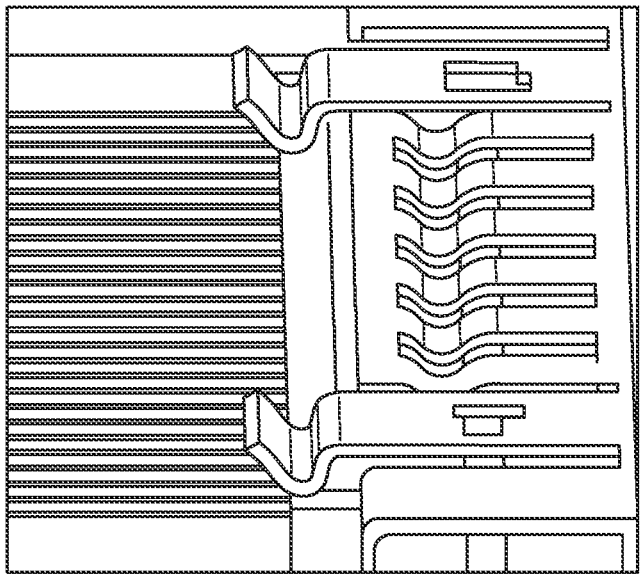
Figure 4F:
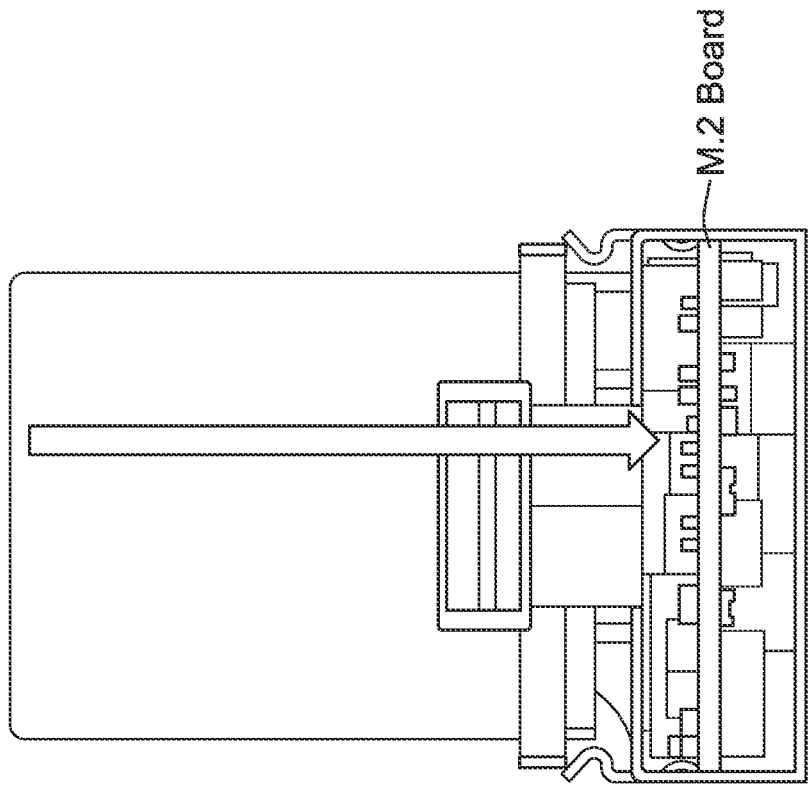

FIG. 4F shows a fifth step of installing a heatsink into a retention carrier. The heatsink is positioned over the heatsink snaps as shown. The heatsink is depressed at the center until the heatsink base engages with the snap features as shown. Inspect all four snaps (lips) to verify engagement. All assembly should be performed in an ESD free environment.

Loading springs (e.g., leaf springs) can modulate load, but ensure that the heatsink is inserted straight and not cantered.

Figure 4G:
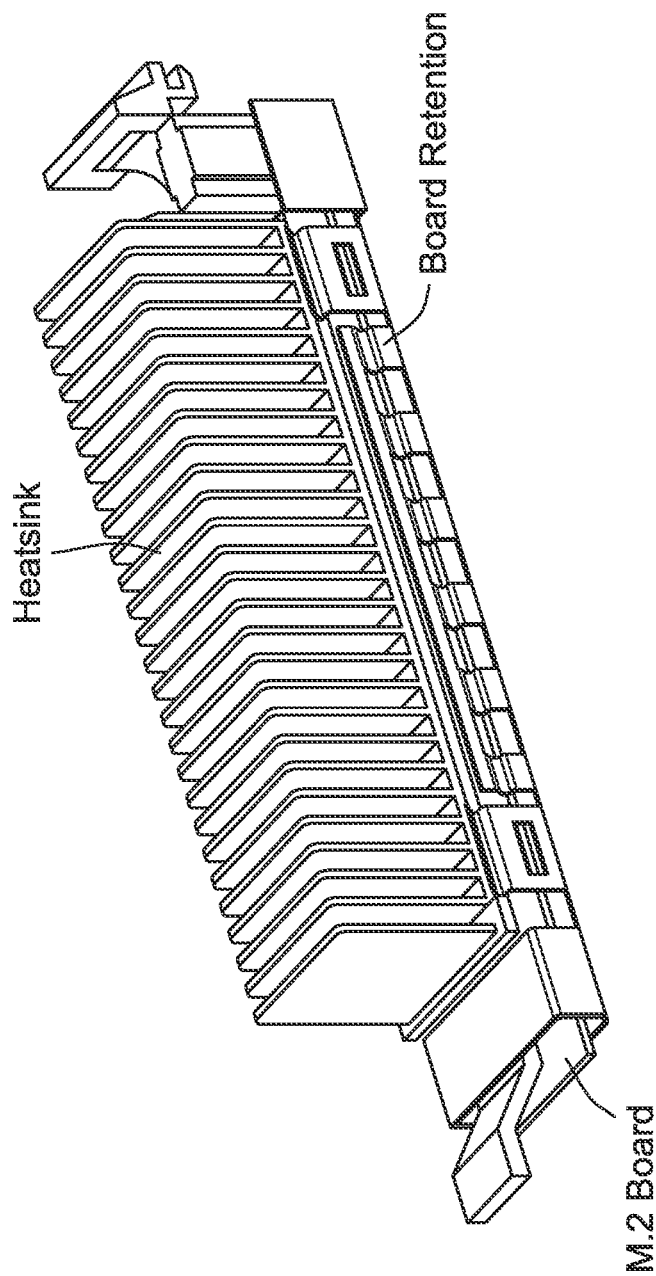

FIG. 4G depicts an assembly with carrier, heat sink, and board. The assembly can be slotted into a multiple carrier rack.

Note that the assembly process of FIGS. 4A-4G do not depict a raised profile stabilizer but stabilizer can be included in the card retainer.

Figure 5:
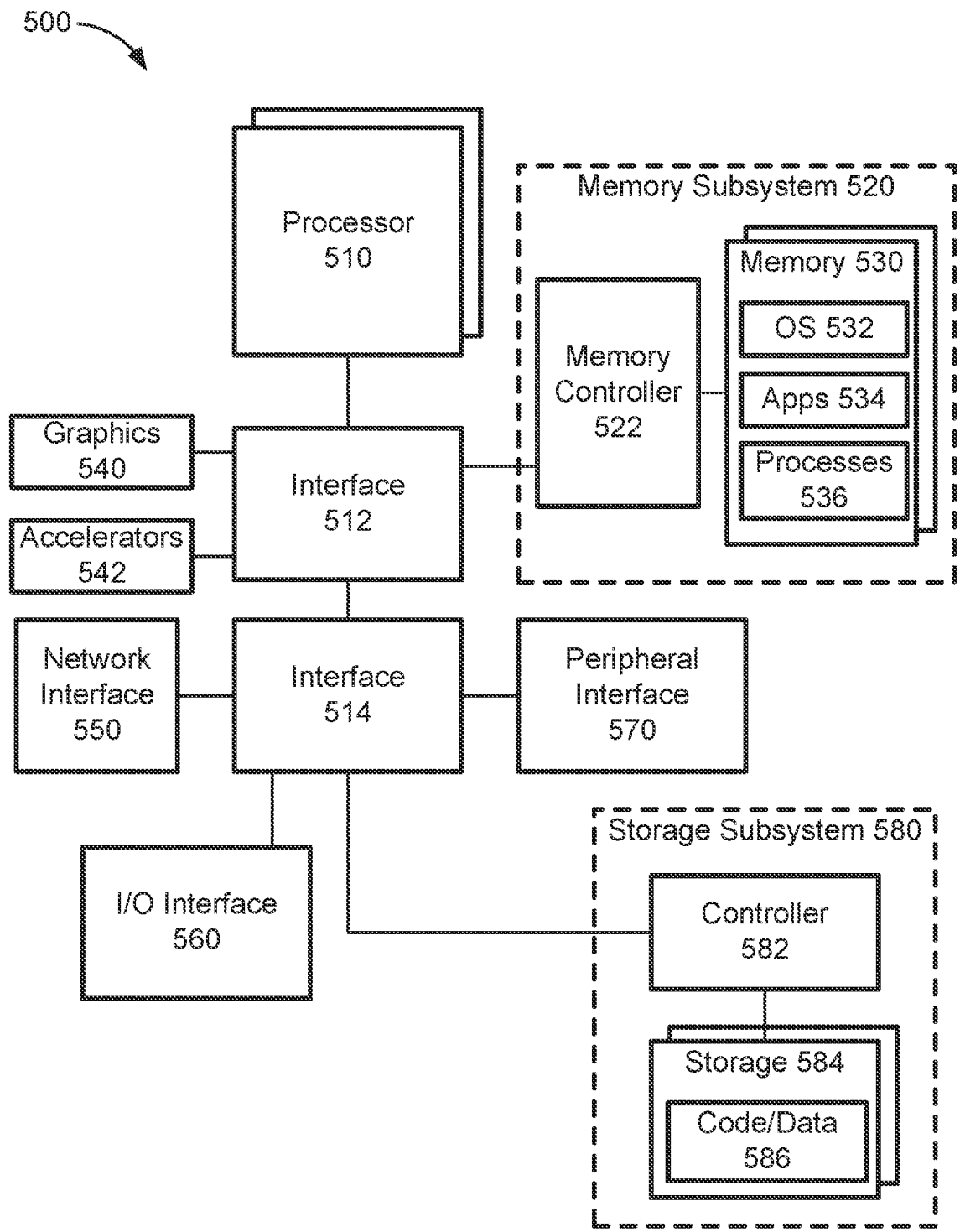
FIG. 5 depicts a system.

FIG. 5 depicts an example system. The system can use embodiments described herein to provide carriers for components of the system for interconnection with other components. System 500 includes processor 510, which provides processing, operation management, and execution of instructions for system 500. Processor 510 can include any type of microprocessor, central processing unit (CPU), graphics processing unit (GPU), processing core, or other processing hardware to provide processing for system 500, or a combination of processors. Processor 510 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 500 includes interface 512 coupled to processor 510, which can represent a higher speed interface or a high throughput interface for system components that needs higher bandwidth connections, such as memory subsystem 520 or graphics interface components 540, or accelerators 542. Interface 512 represents an interface circuit, which can be a standalone component or integrated onto a processor die. Where present, graphics interface 540 interfaces to graphics components for providing a visual display to a user of system 500. In one example, graphics interface 540 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 540 generates a display based on data stored in memory 530 or based on operations executed by processor 510 or both. In one example, graphics interface 540 generates a display based on data stored in memory 530 or based on operations executed by processor 510 or both.

Accelerators 542 can be a fixed function offload engine that can be accessed or used by a processor 510. For example, an accelerator among accelerators 542 can provide compression (DC) capability, cryptography services such as public key encryption (PKE), cipher, hash/authentication capabilities, decryption, or other capabilities or services. In some embodiments, in addition or alternatively, an accelerator among accelerators 542 provides field select controller capabilities as described herein. In some cases, accelerators 542 can be integrated into a CPU socket (e.g., a connector to a motherboard or circuit board that includes a CPU and provides an electrical interface with the CPU). For example, accelerators 542 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 542 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 520 represents the main memory of system 500 and provides storage for code to be executed by processor 510, or data values to be used in executing a routine. Memory subsystem 520 can include one or more memory devices 530 such as read-only memory (ROM), flash memory, one or more varieties of random access memory (RAM) such as DRAM, or other memory devices, or a combination of such devices. Memory 530 stores and hosts, among other things, operating system (OS) 532 to provide a software platform for execution of instructions in system 500. Additionally, applications 534 can execute on the software platform of OS 532 from memory 530. Applications 534 represent programs that have their own operational logic to perform execution of one or more functions. Processes 536 represent agents or routines that provide auxiliary functions to OS 532 or one or more applications 534 or a combination. OS 532, applications 534, and processes 536 provide software logic to provide functions for system 500. In one example, memory subsystem 520 includes memory controller 522, which is a memory controller to generate and issue commands to memory 530. It will be understood that memory controller 522 could be a physical part of processor 510 or a physical part of interface 512. For example, memory controller 522 can be an integrated memory controller, integrated onto a circuit with processor 510.

While not specifically illustrated, it will be understood that system 500 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 500 includes interface 514, which can be coupled to interface 512. In one example, interface 514 represents an interface circuit, which can include standalone components and integrated circuitry. In one example, multiple user interface components or peripheral components, or both, couple to interface 514. Network interface 550 provides system 500 the ability to communicate with remote devices (e.g., servers or other computing devices) over one or more networks. Network interface 550 can include an Ethernet adapter, wireless interconnection components, cellular network interconnection components, USB (universal serial bus), or other wired or wireless standards-based or proprietary interfaces. Network interface 550 can transmit data to a device that is in the same data center or rack or a remote device, which can include sending data stored in memory. Network interface 550 can receive data from a remote device, which can include storing received data into memory. Various embodiments can be used in connection with network interface 550, processor 510, and memory subsystem 520.

In one example, system 500 includes one or more input/output (I/O) interface(s) 560. I/O interface 560 can include one or more interface components through which a user interacts with system 500 (e.g., audio, alphanumeric, tactile/touch, or other interfacing). Peripheral interface 570 can include any hardware interface not specifically mentioned above. Peripherals refer generally to devices that connect dependently to system 500. A dependent connection is one where system 500 provides the software platform or hardware platform or both on which operation executes, and with which a user interacts.

In one example, system 500 includes storage subsystem 580 to store data in a nonvolatile manner. In one example, in certain system implementations, at least certain components of storage 580 can overlap with components of memory subsystem 520. Storage subsystem 580 includes storage device(s) 584, which can be or include any conventional medium for storing large amounts of data in a nonvolatile manner, such as one or more magnetic, solid state, or optical based disks, or a combination. Storage 584 holds code or instructions and data 586 in a persistent state (i.e., the value is retained despite interruption of power to system 500). Storage 584 can be generically considered to be a "memory," although memory 530 is typically the executing or operating memory to provide instructions to processor 510. Whereas storage 584 is nonvolatile, memory 530 can include volatile memory (i.e., the value or state of the data is indeterminate if power is interrupted to system 500). In one example, storage subsystem 580 includes controller 582 to interface with storage 584. In one example controller 582 is a physical part of interface 514 or processor 510 or can include circuits or logic in both processor 510 and interface 514.

A volatile memory is memory whose state (and therefore the data stored in it) is indeterminate if power is interrupted to the device. Dynamic volatile memory uses refreshing the data stored in the device to maintain state. One example of dynamic volatile memory includes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 500. More specifically, power source typically interfaces to one or multiple power supplies in system 500 to provide power to the components of system 500. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 500 can be implemented using interconnected compute sleds of processors, memories, storages, network interfaces, and other components. High speed connection can provide communications using one or more of an electrical and/or optical bus, interconnect, fabric, or network compatible or compliant with one or more of: Ethernet (IEEE 802.3), remote direct memory access (RDMA), InfiniBand, Internet Wide Area RDMA Protocol (iWARP), quick UDP Internet Connections (QUIC), RDMA over Converged Ethernet (RoCE), Peripheral Component Interconnect express (PCIe), Intel QuickPath Interconnect (QPI), Intel Ultra Path Interconnect (UPI), Intel On-Chip System Fabric (IOSF), Omnipath, Compute Express Link (CXL), HyperTransport, high-speed fabric, NVLink, Advanced Microcontroller Bus Architecture (AMBA) interconnect, OpenCAPI, Gen-Z, Cache Coherent Interconnect for Accelerators (CCIX), 3GPP Long Term Evolution (LTE) (4G), 3GPP 5G, and variations thereof. Data can be copied or stored to virtualized storage nodes using a protocol such as NVMe over Fabrics (NVMe-oF) or NVMe.

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, a blade includes components common to conventional servers, including a main printed circuit board (main board) providing internal wiring (i.e., buses) for coupling appropriate integrated circuits (ICs) and other components mounted to the board.

Various embodiments can be used in a base station that supports communications using wired or wireless protocols (e.g., 3GPP Long Term Evolution (LTE) (4G) or 3GPP 5G), on-premises data centers, off-premises data centers, edge network elements, fog network elements, and/or hybrid data centers (e.g., data center that use virtualization, cloud and software-defined networking to deliver application workloads across physical data centers and distributed multi-cloud environments).

Figure 6:
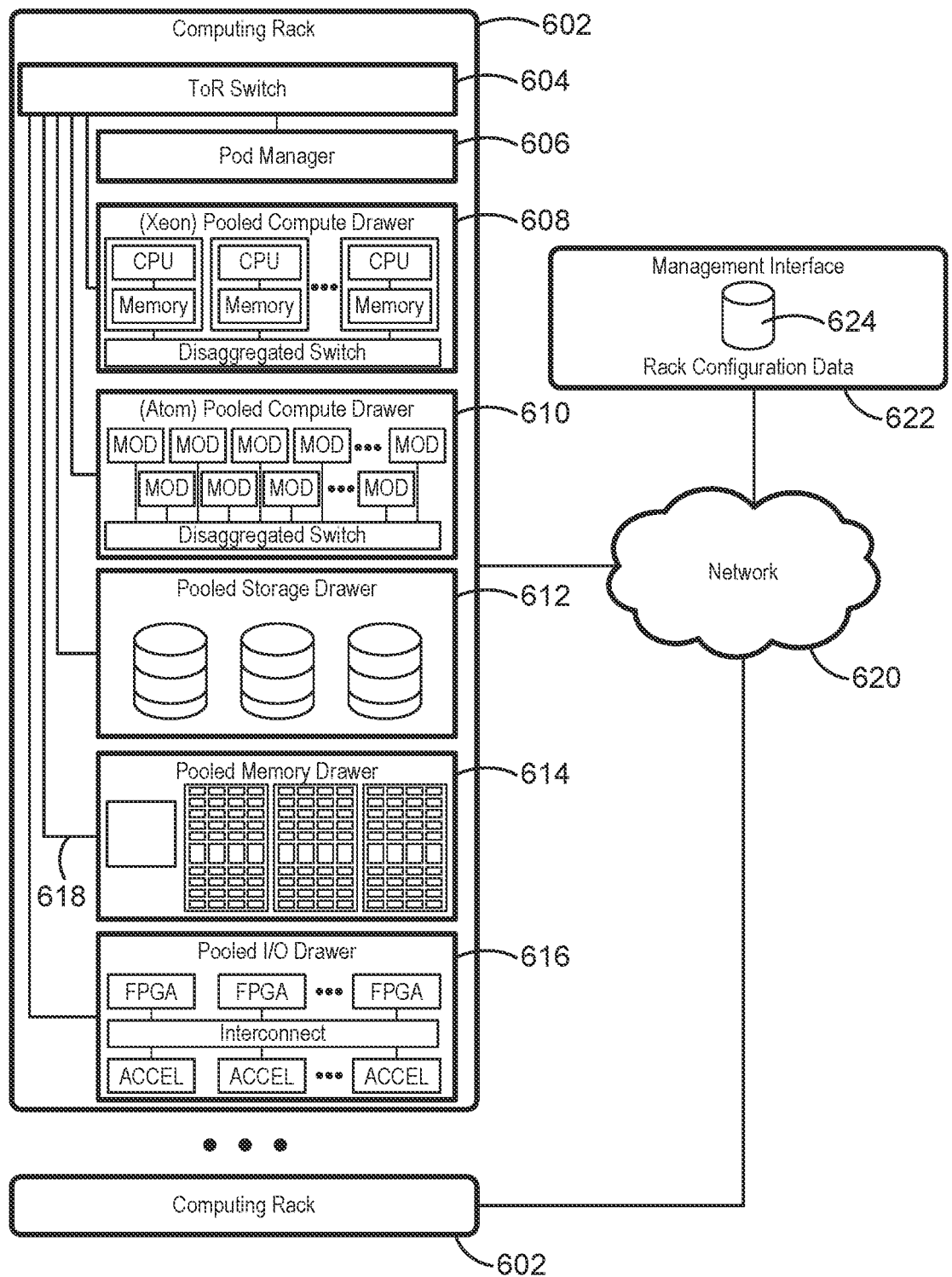
FIG. 6 depicts an environment.

FIG. 6 depicts an environment 600 includes multiple computing racks 602, one or more including a Top of Rack (ToR) switch 604, a pod manager 606, and a plurality of pooled system drawers. Various embodiments can be used among racks to share content or data or results of processing or storing content. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® XEON® pooled computer drawer 608, and Intel® ATOM™ pooled compute drawer 610, a pooled storage drawer 612, a pooled memory drawer 614, and a pooled I/O drawer 616. Any of the pooled system drawers is connected to ToR switch 604 via a high-speed link 618, such as a 40 Gigabit/second (Gb/s) or 100 Gb/s Ethernet link or a 100+Gb/s Silicon Photonics (SiPh) optical link, or higher speeds.

Multiple of the computing racks 602 may be interconnected via their ToR switches 604 (e.g., to a pod-level switch or data center switch), as illustrated by connections to a network 620. In some embodiments, groups of computing racks 602 are managed as separate pods via pod manager(s) 606. In one embodiment, a single pod manager is used to manage all of the racks in the pod. Alternatively, distributed pod managers may be used for pod management operations.

Environment 600 further includes a management interface 622 that is used to manage various aspects of the environment. This includes managing rack configuration, with corresponding parameters stored as rack configuration data 624.

Figure 7:
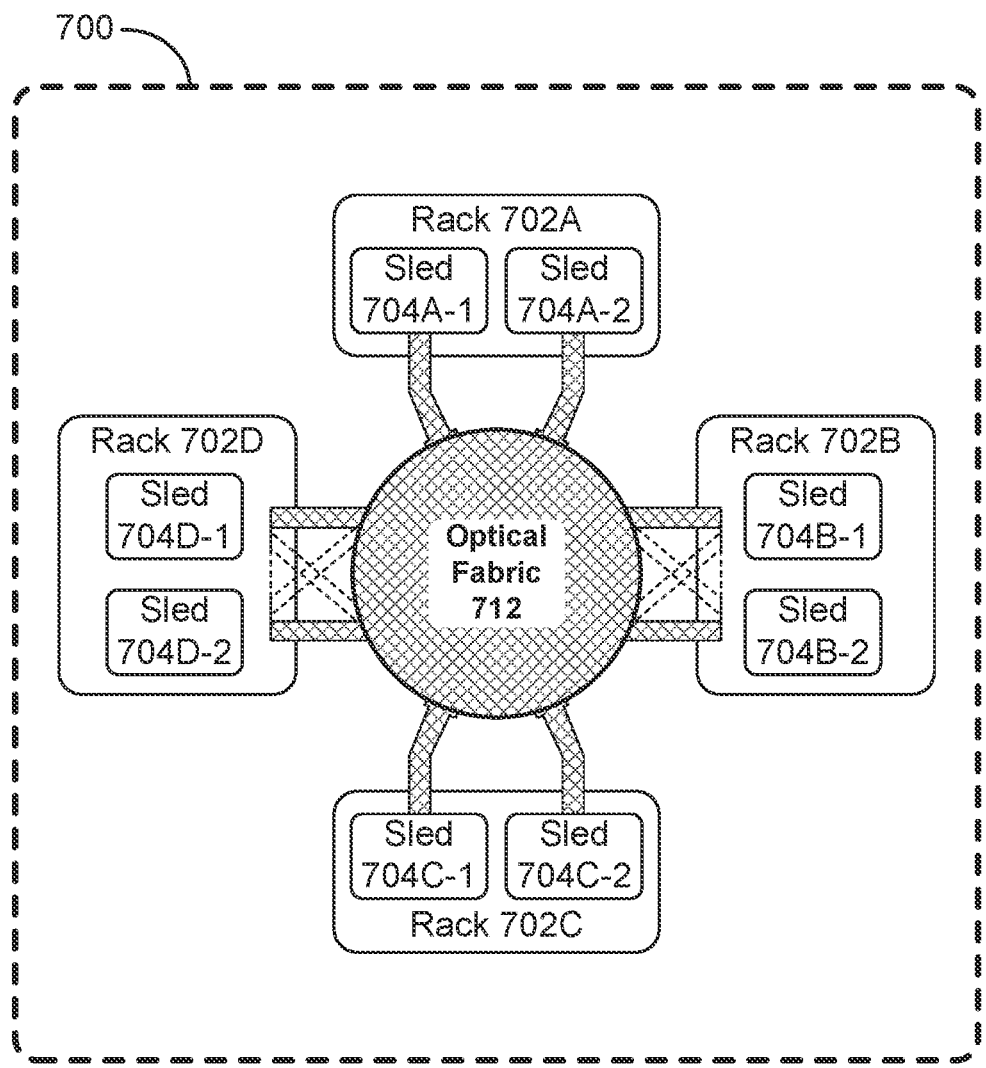
FIG. 7 depicts an example of a data center.

FIG. 7 depicts an example of a data center. Various embodiments can be used in or with the data center of FIG. 7 to affix circuit boards to connectors. As shown in FIG. 7, data center 700 may include an electrical and/or optical fabric 712. Optical fabric 712 may generally include a combination of optical signaling media (such as optical cabling) and optical switching infrastructure via which any particular sled in data center 700 can send signals to (and receive signals from) each of the other sleds in data center 700. The signaling connectivity that optical fabric 712 provides to any given sled may include connectivity both to other sleds in a same rack and sleds in other racks. Data center 700 includes four racks 702A to 702D and racks 702A to 702D house respective pairs of sleds 704A-1 and 704A-2, 704B-1 and 704B-2, 704C-1 and 704C-2, and 704D-1 and 704D-2. Thus, in this example, data center 700 includes a total of eight sleds. Optical fabric 712 can provide each sled signaling connectivity with one or more of the seven other sleds. For example, via optical fabric 712, sled 704A-1 in rack 702A may possess signaling connectivity with sled 704A-2 in rack 702A, as well as the six other sleds 704B-1, 704B-2, 704C-1, 704C-2, 704D-1, and 704D-2 that are distributed among the other racks 702B, 702C, and 702D of data center 700. The embodiments are not limited to this example. For example, fabric 1012 can provide optical and/or electrical signaling.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry." A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function.

The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

Example 1 includes an apparatus comprising: at least one leaf spring protrusion to provide a force against a circuit board, wherein a thickness and angle of the at least one leaf spring protrusion is set to adjust the force against the circuit board and at least one retention clip, in part, capable to maintain a plane of a heat sink relative to the circuit board.

Example 2 includes any example and includes a base surface to which the at least one leaf spring protrusion is attached and to which the at least one retention clip is attached and a stabilizer formed on at least one side of a retention clip and fixed to the base surface.

Example 3 includes any example and includes a base surface to which the at least one leaf spring protrusion is attached and to which the at least one retention clip is attached and at least two card retainers fixed to the base surface.

Example 4 includes any example and includes a retention carrier capable to physically hold a heat sink and a circuit board, the retention carrier comprising: a base surface to which the at least one leaf spring protrusion is attached and to which the at least one retention clip is attached; a stabilizer formed on at least one side of a retention clip and fixed to the base surface; and at least two card retainers fixed to the base surface.

Example 5 includes any example and includes a base surface to which the at least one leaf spring protrusion is attached and to which the at least one retention clip is attached and a folder-over portion of a handle, the fold-over portion formed at a height away from the base surface to avoid physical contact with circuits of the circuit board.

Example 6 includes any example and includes a base surface to which the at least one leaf spring protrusion is attached and to which the at least one retention clip is attached; at least two card retainers fixed to the base surface; and an M.2x circuit board held by at the least two card retainers and the at least one leaf spring protrusion, where x is an integer.

Example 7 includes any example, wherein a card retainer comprises a shelf and further comprising: a heat sink fastened at least by a retention clip and opposed by the shelf.

Example 8 includes any example and includes a switch communicatively coupled to the circuit board to provide communicative coupling with at least one other circuit board.

Example 9 includes any example, wherein the circuit board comprises one or more of: storage, volatile memory, persistent memory, central processing unit, accelerator, or graphics processing unit.

Example 10 includes any example, and includes an insulation layer affixed to the circuit board and opposite the base surface.

Example 11 includes any example, and includes a Thermal Interface Material layer affixed to the heat sink.

Example 12 includes any example, and includes one or more of: a data center, rack, switch, fabric, or interconnect.

Example 13 includes any example, wherein the at least one leaf spring protrusion comprises SK7 spring steel with at least 0.4 mm thickness.

Example 14 includes a method comprising: performing a tool-less mounting of a board to a retention carrier by use of the card retainer with vertical separation from the base provided by the at least one leaf spring, wherein the retention carrier comprises a base, at least one leaf spring affixed to the base, at least one card retainer, and a heat sink retention clip and mounting a heat sink to the retention carrier by use of the heat sink retention clip and a lip of a card retainer.

Example 15 includes any example, and includes mounting a thermal interface material to a bottom surface of the heat sink that opposes a board.

Example 16 includes any example, wherein the board comprises an M.2x board, where x is an integer.

Example 17 includes any example, and includes affixing an insulation layer to a surface of a board opposite of the base.

Example 18 includes any example, wherein the performing a tool-less mounting of a board to a retention carrier by use of the card retainer with vertical separation from the base provided by the at least one leaf spring comprises: sliding the board into the at least one card retainer with a force applied against a bottom of the board by at least one leaf spring.

Example 19 includes any example, wherein the retention carrier comprises SK7 spring steel with at least 0.3 mm thickness.

Example 20 includes any example, and includes: connecting the board to a Peripheral Component Interconnect express (PCIe) connection.

Example 21 includes any example, wherein a thickness or length of a leaf spring is adjusted to adjust a force applied to the board.

What is claimed is:

1. An apparatus comprising:
   a leaf spring protrusion to provide a force against a circuit board, wherein a thickness and angle of the leaf spring protrusion is set to adjust the force against the circuit board;
   at least two card retainers associated with respective shelves; and
   a retention clip, in part, capable to maintain a plane of a heat sink relative to the circuit board, the retention clip including a protruding lip;
   wherein, when the heat sink is received in the apparatus, the protruding lip is to engage a top surface of the heat sink with downward pressure, and the respective shelves of the at least two card retainers are to engage a bottom surface of the heat sink with upward pressure opposing the downward pressure.

2. The apparatus of claim 1, including:
   a base surface to which the leaf spring protrusion is attached and to which the retention clip is attached; and
   a stabilizer formed on a side of the retention clip and fixed to the base surface.

3. The apparatus of claim 1, including a base surface to which the leaf spring protrusion is attached and to which the retention clip is attached and wherein the at least two card retainers fixed to the base surface.

4. The apparatus of claim 1, including a retention carrier capable to physically hold the heat sink and the circuit board, the retention carrier including:
   a base surface to which the leaf spring protrusion is attached and to which the retention clip is attached; and
   a stabilizer formed on a side of the retention clip and fixed to the base surface.

5. The apparatus of claim 1, including:
   a base surface to which the leaf spring protrusion is attached and to which the retention clip is attached; and
   a fold-over portion of a handle, the fold-over portion formed at a height away from the base surface to avoid physical contact with circuits of the circuit board.

6. The apparatus of claim 1, further including:
   a base surface to which the leaf spring protrusion is attached and to which the retention clip is attached; and
   an M.2x circuit board held by the at least two card retainers and the leaf spring protrusion, where x is an integer.

7. The apparatus of claim 6, further including the heat sink fastened at least by the retention clip and opposed by a first shelf of the respective shelves.

8. The apparatus of claim 6, further including:
   a switch communicatively coupled to the circuit board to provide communicative coupling with an other circuit board.

9. The apparatus of claim 6, wherein the circuit board includes one or more of:
   storage, volatile memory, persistent memory, central processing unit, accelerator, or graphics processing unit.

10. The apparatus of claim 6, including an insulation layer affixed to the circuit board and opposite the base surface.

11. The apparatus of claim 7, including a Thermal Interface Material layer affixed to the heat sink.

12. The apparatus of claim 1, further including one or more of: a data center, rack, switch, fabric, or interconnect.

13. The apparatus of claim 1, wherein the leaf spring protrusion comprises SK7 spring steel with at least 0.3 mm thickness.

* * * * *